(12) United States Patent
Kim et al.

(10) Patent No.: US 12,660,316 B2
(45) Date of Patent: Jun. 16, 2026

(54) DISPLAY DEVICE, METHOD OF MANUFACTURING THE SAME AND TILED DISPLAY DEVICE INCLUDING THE SAME

(71) Applicant: Samsung Display Co., LTD., Yongin-si (KR)

(72) Inventors: Byung Hoon Kim, Hwaseong-si (KR); Yong Hoon Kwon, Suwon-si (KR); Mi Sun Kim, Hwaseong-si (KR); Tae Oh Kim, Suwon-si (KR); Dong Sung Lee, Suwon-si (KR); Se Hun Choi, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 814 days.

(21) Appl. No.: 17/974,620

(22) Filed: Oct. 27, 2022

(65) Prior Publication Data

US 2023/0275103 A1 Aug. 31, 2023

(30) Foreign Application Priority Data

Feb. 28, 2022 (KR) ........................ 10-2022-0025738

(51) Int. Cl.
H10W 90/00 (2026.01)
H10D 86/01 (2025.01)
(Continued)

(52) U.S. Cl.
CPC ......... H10D 86/60 (2025.01); H10D 86/0212 (2025.01); H10D 86/451 (2025.01); H10W 90/00 (2026.01); H10W 72/01951 (2026.01);

*H10W 72/90* (2026.01); *H10W 72/923* (2026.01); *H10W 72/9415* (2026.01); (Continued)

(58) Field of Classification Search
CPC .... H10H 20/851; H10H 29/142; H10H 20/83; H10D 86/60; H01L 24/03; H01L 24/05; H01L 25/167; G02F 1/13336; G02F 1/13452; G02F 1/13458; G02F 2201/50; (Continued)

(56) References Cited

U.S. PATENT DOCUMENTS

2017/0176808 A1* 6/2017 Sano .................... G02F 1/13452
2019/0385513 A1* 12/2019 Iguchi ...................... G09G 3/32

FOREIGN PATENT DOCUMENTS

CN         111524859 A * 8/2020 ........... H01L 25/167
JP         2017-161887     9/2017
(Continued)

*Primary Examiner* — Wael M Fahmy
*Assistant Examiner* — Fernando Jose Ramos-Diaz
(74) *Attorney, Agent, or Firm* — Womble Bond Dickinson (US) LLP

(57) ABSTRACT

A display device comprises a first substrate including a first contact hole, a first barrier insulating layer disposed on the first substrate and including second contact holes overlapping the first contact hole, pad electrodes disposed on the first barrier insulating layer, at least a subset of the pad electrodes being disposed in the second contact holes, a display layer disposed on the pad electrodes, and a flexible film disposed below the first substrate and electrically connected to the pad electrodes through the first contact hole and the second contact holes, wherein the first substrate includes a substrate buffer portion overlapping the first contact hole and not-overlapping the second contact holes.

9 Claims, 26 Drawing Sheets

(51) Int. Cl.

| | | |
|---|---|---|
| *H10D 86/40* | (2025.01) | |
| *H10D 86/60* | (2025.01) | |
| *H10W 72/00* | (2026.01) | |
| *H10W 72/90* | (2026.01) | |

(52) U.S. Cl.
CPC ........ *H10W 72/942* (2026.01); *H10W 72/952* (2026.01); *H10W 90/724* (2026.01)

(58) Field of Classification Search
CPC . H10K 59/124; H10K 59/131; H10K 59/8731
See application file for complete search history.

(56) References Cited

FOREIGN PATENT DOCUMENTS

| | | | | |
|---|---|---|---|---|
| JP | 2017161887 | A | * | 9/2017 |
| KR | 10-2013-0092857 | | | 8/2013 |

* cited by examiner

LA: LA1, LA2, LA3

NDA | DA

BA | LA1 | BA | LA2 | BA | LA3 | BA

WLC1 | WLC2 | LTU

CF1 | WLS1 | SCT1 | BS1 | CF2 | WLS2 | SCT2 | BS2 | CF3 | SCT3 | BS3

ARF
TFE
PV3
BK2 } CFL
OC2
PV2
BK1 } WLCL
PAS3
SB } EML
PAS1
OC1
PV1
ILD } TFTL
GI
BF

BK2

BK1

CTE2 | CTE1 | SB | BP | PAS2 | BP | SB | RME2 | ED | RME1

CNE2 | CNE1

CNT2 | PD1 | PD2 | A

SUB2
BIL2
BIL1
SUB1

I | I'

CNT1 | PAE | ACF | ADM | DIC | FPCB

SE | GE | ACT | DE | BML

TFT

Z
↑
⊗ → X
Y

DPL: TFTL, EML, WLCL, CFL
ACTL: ACT, DE, SE
CNE: CNE1, CNE2
LA: LA1, LA2, LA3
PD: PD1, PD2

PD: PD1, PD2
SCNT: SCNT1, SCNT2

SCNT: SCNT1, SCNT2

SUB1

LA1    LA2    BA    LA3

CNT1

PD    CNT2    FPCB    DIC

Z ⊗ → X

Y

NDA | DA

BA | LA1 | BA | LA2 | BA | LA3 | BA

WLC1 | WLC2 | LTU

CF1 | WLS1 SCT1 | BS1 | CF2 | WLS2 SCT2 | BS2 | CF3 | SCT3 | BS3

ARF
TFE
PV3
BK2 } CFL
OC2
PV2
BK1 } WLCL
PAS3
SB
PAS1 } EML
OC1
PV1
ILD
GI } TFTL
BF

BK2

BK1

CTE2 CTE1 | SB | BP PAS2 BP | SB | RME2 ED RME1

CNE2 | CNE1

SUB2
BIL2
BIL1
SUB1

I | CNT2 PD1 PD2 | SE GE ACT DE | BML | I'

PD

TFT

DPL: TFTL, EML, WLCL, CFL
ACTL: ACT, DE, SE
CNE: CNE1, CNE2
LA: LA1, LA2, LA3

Z
↑
⊗ → X
Y

PD: PD1, PD2

PD: PD1, PD2

PD: PD1, PD2

PD: PD1, PD2
SCNT: SCNT1, SCNT2

PD: PD1, PD2
SCNT: SCNT1, SCNT2

DPL: TFTL, EML, WLCL, CFL
ACTL: ACT, DE, SE
CNE: CNE1, CNE2
LA: LA1, LA2, LA3
PD: PD1, PD2
SCNT: SCNT1, SCNT2

PD: PD1, PD2
SCNT: SCNT1, SCNT2

PD: PD1, PD2

PD: PD1, PD2

PD: PD1, PD2

DISPLAY DEVICE, METHOD OF MANUFACTURING THE SAME AND TILED DISPLAY DEVICE INCLUDING THE SAME

CROSS-REFERENCE TO RELATED APPLICATION(S)

This application claims priority to and benefits of Korean Patent Application No. 10-2022-0025738 under 35 U.S.C. 119, filed on Feb. 28, 2022 in the Korean Intellectual Property Office, the entire contents of which are herein incorporated by reference.

BACKGROUND

1. Technical Field

The disclosure relates to a display device, a method of manufacturing the same, and a tiled display device including the same.

2. Description of the Related Art

As the information society develops, the demand for display devices for displaying images is increasing in various forms. For example, display devices have been applied to various electronic devices such as smartphones, digital cameras, laptop computers, navigation devices, and smart televisions. A display device may be a flat panel display device such as a liquid crystal display device, a field emission display device, or an organic light emitting display device. Among flat panel display devices, the light emitting display device may include a light emitting element in which each pixel of a display panel may emit light by itself, thereby displaying an image without a backlight unit providing light to the display panel.

In manufacturing a large size display device, a defect rate of the light emitting element may increase due to an increase in the number of pixels, and productivity or reliability may decrease. In order to solve such a problem, a tiled display device may realize a screen having a large size by connecting multiple display devices having a relatively small size to each other. The tiled display device may include boundary portions called seams between the display devices due to a non-display area or a bezel area of each of the display devices adjacent to each other. In case that an image is displayed on the entire screen (tiled display), the boundary portions between the display devices provide a sense of discontinuity to the entire screen such that a degree of immersion of the image may be diminished.

SUMMARY

Aspects of the disclosure provide a display device capable of preventing damage to a substrate during a manufacturing process of the display device, a method of manufacturing the same, and a tiled display device including the same.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include a first substrate including a first contact hole, a first barrier insulating layer disposed on the first substrate and including second contact holes overlapping the first contact hole, pad electrodes disposed on the first barrier insulating layer, at least a subset of the pad electrodes being disposed in the second contact holes, a display layer disposed on the pad electrodes, and a flexible film disposed below the first substrate and electrically connected to the pad electrodes through the first contact hole and the second contact holes. The first substrate may include a substrate buffer portion overlapping the first contact hole and not-overlapping the second contact holes.

In an embodiment, a thickness of the substrate buffer portion may be smaller than a thickness of the first substrate that does not overlap the first contact hole.

In an embodiment, the first substrate may include sub-contact holes overlapping the first contact hole and overlapping the second contact holes.

In an embodiment, the substrate buffer portion may be disposed around the sub-contact holes, and the substrate buffer portion may surround the sub-contact holes.

In an embodiment, the substrate buffer portion may overlap the first barrier insulating layer, and the substrate buffer portion may surround the second contact holes.

In an embodiment, a thickness of the substrate buffer portion may be in a range of about 0.5 μm to about 1.5 μm.

In an embodiment, the pad electrodes may include a first metal layer and a second metal layer disposed on the first metal layer, and the first metal layer may be adjacent to the flexible film.

In an embodiment, the display device may further include a second barrier insulating layer and a second substrate disposed between the pad electrodes and the display layer. The second barrier insulating layer may cover the pad electrodes, and the second substrate may be disposed on the second barrier insulating layer.

In an embodiment, the display device may further include a connection film disposed between the flexible film and the pad electrodes, wherein the connection film electrically connects the pad electrodes and the flexible film to each other.

In an embodiment, the display layer may include a thin film transistor layer disposed on the pad electrodes, a light emitting element layer disposed on the thin film transistor layer, a wavelength conversion layer disposed on the light emitting element layer, and a color filter layer disposed on the wavelength conversion layer.

According to an embodiment of the disclosure, a method of manufacturing a display device may include preparing a first substrate, forming a first barrier insulating layer on a surface of the first substrate, and forming first contact holes in the first barrier insulating layer, forming pad electrodes on the first barrier insulating layer and the first contact holes, forming a display layer on the pad electrode, forming first grooves by performing a first etching on another surface of the first substrate overlapping the first contact hole, forming a second contact hole by performing a second etching on the another surface of the first substrate including the first grooves, and electrically connecting a flexible film onto the pad electrodes.

In an embodiment, the first grooves may be formed to overlap the first contact holes of the first barrier insulating layer and the pad electrodes.

In an embodiment, in the second etching, the first substrate may be etched to form sub-contact holes exposing the pad electrodes, and a substrate buffer portion that does not overlap the first contact holes.

In an embodiment, the first substrate in an area overlapping the first grooves may be completely removed to form the sub-contact holes exposing the pad electrodes, and a portion of the first substrate in an area that does not overlap the first grooves may be removed to form the substrate buffer portion.

In an embodiment, in the second etching, the first substrate may be removed by a thickness to form a second groove in which the first grooves may be disposed on a bottom surface.

In an embodiment, the method may further include forming sub-contact holes exposing the pad electrodes and a substrate buffer portion that does not overlap the first contact holes by performing a third etching on the first substrate disposed in the second groove.

In an embodiment, the third etching may be performed by an atmospheric pressure plasma etching process.

In an embodiment, the first etching and the second etching may be performed by a pulse laser etching process.

According to an embodiment of the disclosure, a method of manufacturing a display device may include preparing a first substrate, forming a first barrier insulating layer on a surface of the first substrate, and forming first contact holes in the first barrier insulating layer, forming pad electrodes on the first barrier insulating layer and the first contact holes, forming a display layer on the pad electrode, forming a second contact hole by performing a first etching on another surface of the first substrate overlapping the first contact hole, forming sub-contact holes exposing the pad electrodes and a substrate buffer portion that does not overlap the first contact holes by performing a second etching on the first substrate disposed in the second contact hole, and electrically connecting a flexible film on the pad electrodes.

According to an embodiment of the disclosure, a tiled display device may include a plurality of display devices including a display area including pixels and a non-display area surrounding the display area, and a coupling member coupling the plurality of display devices to each other. Each of the plurality of display devices may include a first substrate including a first contact hole, a first barrier insulating layer disposed on the first substrate and including second contact holes overlapping the first contact hole, pad electrodes disposed on the first barrier insulating layer, at least a subset of the pad electrodes being disposed in the second contact holes, a display layer disposed on the pad electrodes, and a flexible film disposed below the first substrate and electrically connected to the pad electrodes through the first contact hole and the second contact holes. The first substrate may include a substrate buffer portion overlapping the first contact hole and not-overlapping the second contact holes.

According to the display device, the method of manufacturing the same, and the tiled display device including the same according to embodiments, it may be possible to prevent a second substrate from being damaged by a laser by forming a substrate buffer portion of a first substrate in a process of etching the first substrate.

However, the effects of the embodiments are not restricted to those set forth herein. The above and other effects of the embodiments will become more apparent to one of ordinary skill in the art to which the embodiments pertain by referencing the claims.

BRIEF DESCRIPTION OF THE DRAWINGS

The above and other aspects and features of the disclosure will become more apparent by describing in detail embodiments thereof with reference to the attached drawings, in which:

FIGS. 19 to 22 are schematic cross-sectional views illustrating a method of manufacturing a display device according to another embodiment for each process.

DETAILED DESCRIPTION OF THE EMBODIMENTS

Figure 1:
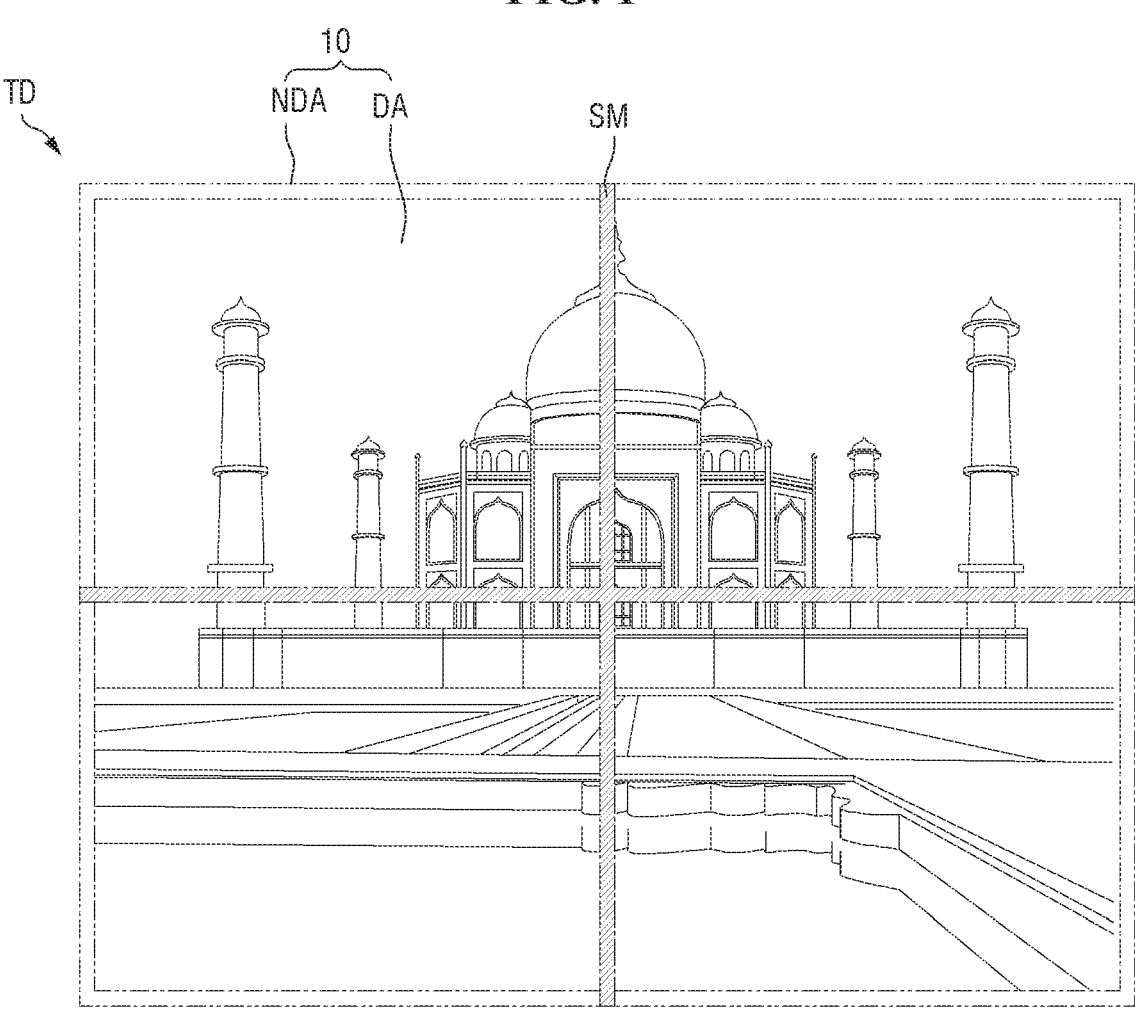
FIG. 1 is a schematic plan view illustrating a tiled display device according to an embodiment.
Figure 1:
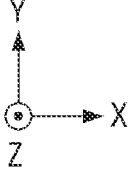

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

It will be understood that the terms "connected to" or "coupled to" or "contacting" may include a physical or electrical connection or coupling.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

Each of the features of the various embodiments of the disclosure may be combined or combined with each other, in part or in whole, and technically various interlocking and driving may be possible. Each embodiment may be implemented independently of each other or may be implemented together in an association.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view illustrating a tiled display device according to an embodiment.

Referring to FIG. 1, a tiled display device TD may include multiple display devices 10. The display devices 10 may be arranged (disposed) in a lattice shape, but are not limited thereto. The display devices 10 may be connected in a first direction (X-axis direction) or a second direction (Y-axis direction), and the tiled display device TD may have a specific shape. For example, each of the display devices 10 may have the same size, but are not limited thereto. As another example, the display devices 10 may have different sizes.

Each of the display devices 10 may have a rectangular shape including a long side and a short side. The display devices 10 may be disposed with long sides or short sides connected to each other. Some of the display devices 10 may be disposed at an edge of the tiled display device TD to form a side of the tiled display device TD. Other display devices 10 may be disposed at a corner of the tiled display device TD, and may form two adjacent sides of the tiled display device TD. Some other display devices 10 may be disposed inside the tiled display device TD, and be surrounded by other display devices 10.

Each of the display devices 10 may include a display area DA and a non-display area NDA. The display area DA may include pixels to display an image. Each of the pixels may include at least one of an organic light emitting diode including an organic light emitting layer, a quantum dot light emitting diode including a quantum dot light emitting layer, an inorganic light emitting diode including an inorganic semiconductor, and a micro light emitting diode (micro LED). Hereinafter, it will be described that each of the pixels includes an inorganic light emitting diode, but the disclosure is not limited thereto. The non-display area NDA may be disposed around the display area DA to surround the display area DA, and may not display an image.

The tiled display device TD may have an overall planar shape, but is not limited thereto. The tiled display device TD may have a three-dimensional shape to provide a three-dimensional effect to a user. For example, in case that the tiled display device TD has the three-dimensional shape, at least some (at least a subset) of the display devices 10 may have a curved shape. As another example, the display devices 10 have a planar shape and may be connected to each other at an angle, such that the tiled display device TD may have a three-dimensional shape.

The tiled display device TD may include a coupling area SM disposed between the display areas DA. The tiled display device TD may be formed by connecting the non-display areas NDA of each of adjacent display devices 10 to each other. The display devices 10 may be connected to each other through a coupling member or an adhesive member disposed in the coupling area SM. The coupling area SM of each of the display devices 10 may not include a pad portion or a flexible film attached to the pad portion. Therefore, a distance between the display areas DA of each of the display devices 10 may be so small that the coupling area SM between the display devices 10 may not be recognized by the user. An external light reflectivity of the display area DA of each of the display devices 10 may be substantially the same as an external light reflectivity of the coupling area SM between the display devices 10. Therefore, the tiled display device TD may remove a sense of discontinuity between the display devices 10 and improve a degree of immersion of an image by preventing the coupling area SM between the display devices 10 from being recognized by the user.

Figure 2:
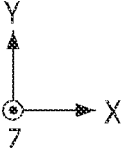
FIG. 2 is a schematic plan view illustrating a display device according to an embodiment.

FIG. 2 is a schematic plan view illustrating a display device according to an embodiment.

Referring to FIG. 2, the display device 10 may include pixels arranged along rows and columns in the display area DA. Each of the pixels may include a light emitting area LA defined by a pixel defining layer or a bank, and may emit light having a peak wavelength through the light emitting area LA. For example, the display area DA of the display device 10 may include first to third light emitting areas LA1, LA2, and LA3. Each of the first to third light emitting areas LA1, LA2, and LA3 may be an area in which light generated by a light emitting element of the display device 10 may be emitted to the outside of the display device 10.

The first to third light emitting areas LA1, LA2, and LA3 may emit light having a peak wavelength to the outside of the display device 10. The first light emitting area LA1 may emit light of a first color, the second light emitting area LA2 may emit light of a second color, and the third light emitting area LA3 may emit light of a third color. For example, the light of the first color may be red light having a peak wavelength in the range of 610 nm to 650 nm, the light of the second color may be green light having a peak wavelength in the range of 510 nm to 550 nm, and the light of the third color may be blue light having a peak wavelength in the range of 440 nm to 480 nm, but the disclosure is not limited thereto.

The first to third light emitting areas LA1, LA2, and LA3 may be sequentially and repeatedly disposed along the first direction (X-axis direction) of the display area DA. For example, an area of the third light emitting area LA3 may be greater than that of the first light emitting area LA1, and the area of the first light emitting area LA1 may be greater than that of the second light emitting area LA2. As another example, the area of the first light emitting area LA1, the area of the second light emitting area LA2, and the area of the third light emitting area LA3 may be substantially the same.

The display area DA of the display device 10 may include a light blocking area BA surrounding the light emitting areas LA. The light blocking area BA may prevent color mixing of light emitted from the first to third light emitting areas LA1, LA2, and LA3.

Figure 3:
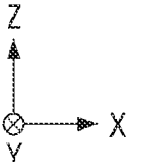
FIG. 3 is a schematic cross-sectional view taken along line I-I' of FIG. 2.
Figure 4:
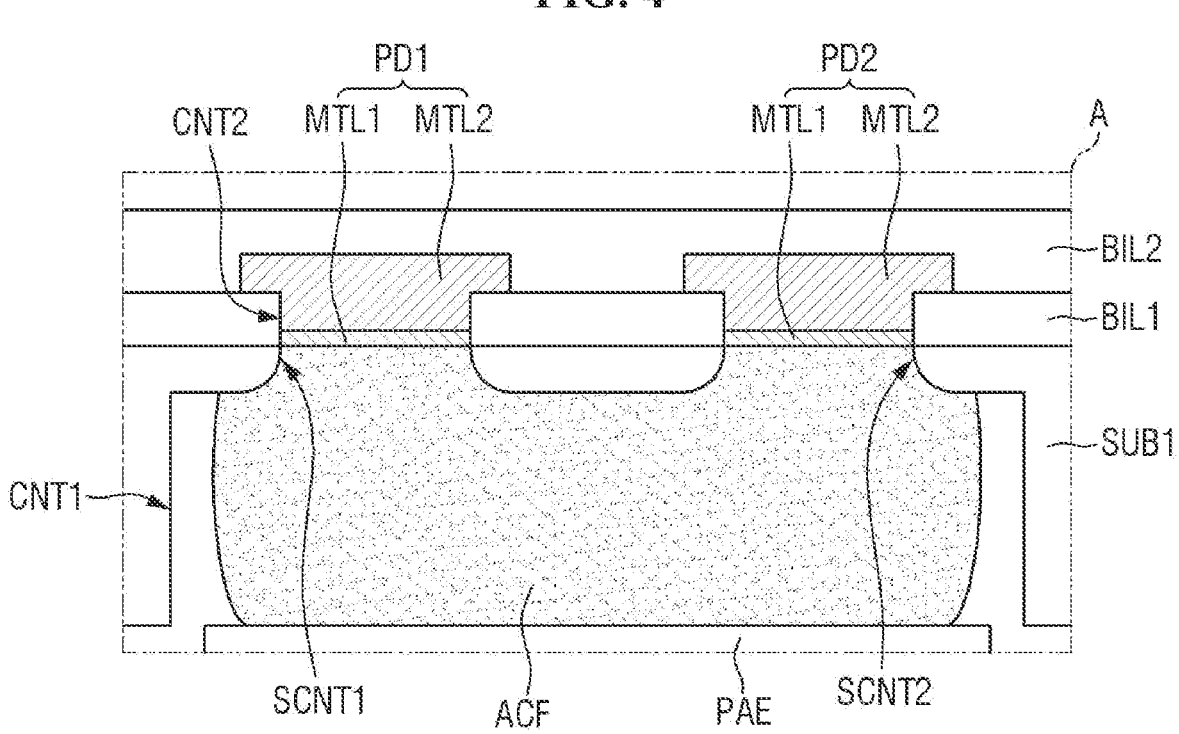
FIG. 4 is an enlarged schematic view of area A of FIG. 3.
Figure 5:
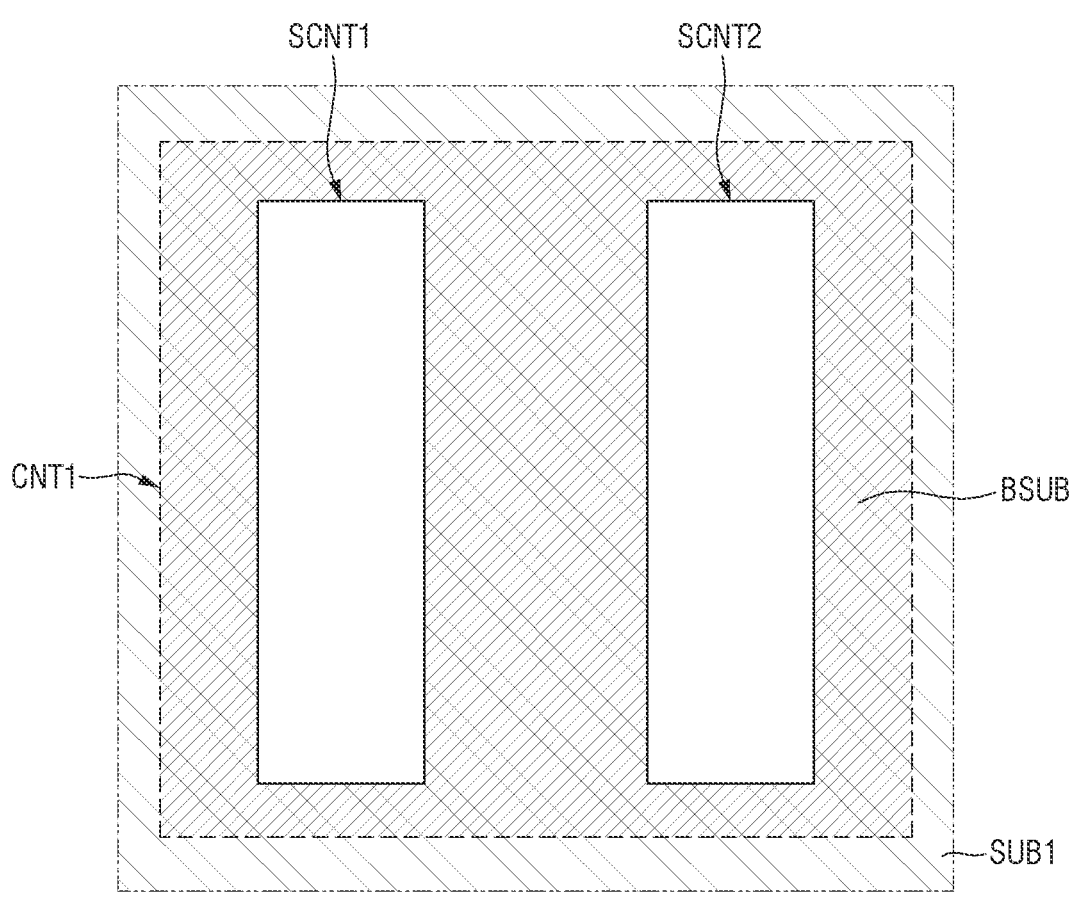
FIG. 5 is a bottom schematic view illustrating a first contact hole portion of a display device according to an embodiment.
Figure 6:
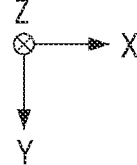
FIG. 6 is a bottom schematic view illustrating a display device according to an embodiment.

FIG. 3 is a schematic cross-sectional view taken along line I-I' of FIG. 2. FIG. 4 is an enlarged schematic view of area A of FIG. 3. FIG. 5 is a bottom schematic view illustrating a first contact hole portion of a display device according to an embodiment. FIG. 6 is a bottom schematic view illustrating a display device according to an embodiment.

Referring to FIGS. 3 to 6, the display area DA of the display device 10 may include first to third light emitting areas LA1, LA2, and LA3. Each of the first to third light emitting areas LA1, LA2, and LA3 may be an area in which light generated by a light emitting element ED of the display device 10 may be emitted to the outside of the display device 10.

The display device 10 may include a first substrate SUB1, a first barrier insulating layer BIL1, a pad electrode PD, a second barrier insulating layer BIL2, a second substrate SUB2, a display layer DPL, an encapsulation layer TFE, an anti-reflection film ARF, a flexible film FPCB, and a display driver DIC.

The first substrate SUB1 may support the display device 10. The first substrate SUB1 may be a base substrate or a base member. The first substrate SUB1 may be a flexible substrate that may be bent, folded, and/or rolled. For example, the first substrate SUB1 may include an insulating material such as a polymer resin, for example, polyimide PI, but is not limited thereto. As another example, the first substrate SUB1 may be a rigid substrate including a glass material.

The first substrate SUB1 may include a first contact hole CNT1 and sub-contact holes SCNT. The first contact hole CNT1 may have a groove shape that may be etched from a lower surface of the first substrate SUB1 and may be recessed up to a portion of the first substrate SUB1. The first contact hole CNT1 may overlap the pad electrodes PD (PD1 and PD2) in a thickness direction (Z-axis direction).

The sub-contact holes SCNT (SCNT1 and SCNT2), which may be holes penetrating through the first substrate SUB1, may be disposed in the first contact hole CNT1. The sub-contact holes SCNT may expose lower surfaces of the pad electrodes PD in a process of manufacturing the display device 10. The sub-contact holes SCNT may include a first sub-contact hole SCNT1 and a second sub-contact hole SCNT2 that expose the pad electrodes PD, respectively. The first sub-contact hole SCNT1 may overlap a first pad electrode PD1 in the thickness direction (Z-axis direction) and expose the first pad electrode PD1. The second sub-contact hole SCNT2 may overlap a second pad electrode PD2 in the thickness direction (Z-axis direction) and expose the second pad electrode PD2. The sub-contact holes SCNT may be disposed to be spaced apart from each other, and a portion of the first substrate SUB1 may be disposed at an interval where the sub-contact holes SCNT may be spaced apart from each other.

A width of the first contact hole CNT1, for example, a width measured in the first direction (X-axis direction) may be greater than a width of each sub-contact hole SCNT. A sum of the widths of each of the sub-contact holes SCNT may be smaller than the width of the first contact hole CNT1. The sub-contact holes SCNT may be disposed within a large width of the first contact hole CNT1. The sub-contact holes SCNT and the first contact hole CNT1 may expose the pad electrodes PD for bonding between the flexible film FPCB and the pad electrodes PD.

The first barrier insulating layer BIL1 may be disposed on the first substrate SUB1. The first barrier insulating layer BIL1 may include an inorganic film capable of preventing permeation of air or moisture. For example, the first barrier insulating layer BIL1 may include at least one of a silicon nitride layer, a silicon oxynitride layer, a silicon oxide layer, a titanium oxide layer, an aluminum oxide layer, and an amorphous silicon layer, but is not limited thereto.

The first barrier insulating layer BIL1 may include second contact holes CNT2. The second contact holes CNT2 may be etched from a lower surface of the first barrier insulating layer BIL1 and penetrate up to an upper surface of the first barrier insulating layer BIL1. The second contact holes CNT2 may be through holes penetrating through the first barrier insulating layer BIL1. The second contact holes CNT2 may expose the pad electrodes PD in the process of manufacturing the display device 10. The second contact holes CNT2 may be disposed to be spaced apart from each other and overlap the sub-contact holes SCNT in the thickness direction (Z-axis direction). The second contact holes CNT2 may be aligned with and coincide with the sub-contact holes SCNT, for example, the first sub-contact hole SCNT1 and the second sub-contact hole SCNT2. The pad electrodes PD may be exposed through the second contact holes CNT2 and the sub-contact holes SCNT.

The pad electrodes PD may be disposed on the first barrier insulating layer BIL1. The pad electrodes PD may be disposed in the display area DA or may be disposed across the display area DA and the non-display area NDA. The display device 10 may include at least a portion of the pad electrodes PD disposed in the display area DA, thereby minimizing an area of the non-display area NDA. Although not illustrated, the pad electrodes PD may be electrically connected to a thin film transistor TFT of the pixel. Therefore, the pad electrodes PD may supply an electrical signal transmitted from the flexible film FPCB to the thin film transistor TFT of the pixel.

The pad electrodes PD may overlap the first contact hole CNT1, the sub-contact holes SCNT, and the second contact holes CNT2, and may be exposed to the outside through the first contact hole CNT1, the sub-contact holes SCNT, and the second contact holes CNT2. The pad electrodes PD may be disposed to extend from the upper surface of the first barrier insulating layer BIL1 into the second contact hole CNT2.

The pad electrodes PD may include a first metal layer MTL1 and a second metal layer MTL2. The first metal layer MTL1 may form a lower layer of the pad electrode PD, and the second metal layer MTL2 may be disposed on the first metal layer MTL1 to form an upper layer of the pad electrode PD. The first metal layer MTL1 may be disposed on a lower side of the upper surface of the first barrier insulating layer BIL1. As the first metal layer MTL1 may be deposited after the second contact holes CNT2 may be formed in the first barrier insulating layer BIL1, the first metal layer MTL1 may be disposed on the lower side of the upper surface of the first barrier insulating layer BIL1. For example, an upper surface of the first metal layer MTL1 may be disposed on the lower side of the upper surface of the first barrier insulating layer BIL1. A portion of the second metal layer MTL2 may be disposed on the lower side of the upper surface of the first barrier insulating layer BIL1. For example, a lower surface of the second metal layer MTL2 may be disposed on the lower side of the upper surface of the first barrier insulating layer BIL1, and an upper surface of the second metal layer MTL2 may be disposed on an upper side of the upper surface of the first barrier insulating layer BIL1.

The first metal layer MTL1 and the second metal layer MTL2 may include a metal. The first metal layer MTL1 may serve to cap the second metal layer MTL2, and the second metal layer MTL2 may serve as a low-resistance wiring of the pad electrode PD. For example, the first metal layer MTL1 may include titanium (Ti) and the second metal layer MTL2 may include copper (Cu). However, the disclosure is not limited thereto, and any metal may be applied as the second metal layer MTL2 as long as it has a low resistance. A thickness of the first metal layer MTL1 may be about 100 to 300 Å, and a thickness of the second metal layer MTL2 may be 3000 to 5000 Å. However, the disclosure is not limited thereto.

As illustrated in FIGS. 4 and 5, in an embodiment, the first substrate SUB1 may include a substrate buffer portion BSUB disposed in an area overlapping the first contact hole CNT1. The substrate buffer portion BSUB may correspond to an area in which a thickness of the first substrate SUB1 may be relatively thin. For example, a thickness of the substrate buffer portion BSUB may be smaller than the thickness of the first substrate SUB1 that does not overlap the first contact hole CNT1. The substrate buffer portion BSUB may overlap the first contact hole CNT1 and may not overlap the second contact hole CNT2. The substrate buffer portion B SUB may be disposed around the second contact hole CNT2 and may be disposed to surround the second contact hole CNT2. The substrate buffer portion BSUB may be disposed around the first sub-contact hole SCNT1 and the second sub-contact hole SCNT2, and may be disposed to surround the first sub-contact hole SCNT1 and the second sub-contact hole SCNT2.

The substrate buffer portion BSUB may prevent a laser from being transmitted through the first substrate SUB1 and further transmitted upward during the process of manufacturing the display device 10. The first substrate SUB1 may be irradiated with the laser to form the first contact hole CNT1. As the first substrate SUB1 may be etched, the thickness of the first substrate SUB1 decreases and a transmittance of the laser gradually increases, which may damage the second substrate SUB2 disposed thereon. According to the embodiment, it may be possible to prevent the second substrate SUB2 from being damaged by the laser in the process of forming the first contact hole CNT1 by forming the substrate buffer portion BSUB on the first substrate SUB1.

The substrate buffer portion BSUB may have a thickness smaller than that of the first substrate SUB1, for example, about 0.5 μm to about 1.5 μm. Here, in case that the thickness of the substrate buffer portion BSUB is about 0.5 μm or more, the laser may be transmitted through the second substrate SUB2 to prevent damage to the second substrate SUB2. In case that the thickness of the substrate buffer portion BSUB is about 1.5 μm or less, it may be smaller than a diameter of a conductive ball included in a connection film ACF, which facilitates a connection between the pad electrode PD and the conductive ball.

The second barrier insulating layer BIL2 may be disposed on the first barrier insulating layer BIL1 and the pad electrodes PD. The second barrier insulating layer BIL2 may insulate the pad electrodes PD. The second barrier insulating layer BIL2 may include an inorganic film capable of preventing permeation of air or moisture. For example, the second barrier insulating layer BIL2 may include at least one of a silicon nitride layer, a silicon oxynitride layer, a silicon oxide layer, a titanium oxide layer, an aluminum oxide layer, and an amorphous silicon layer, but is not limited thereto.

The second substrate SUB2 may be disposed on the second barrier insulating layer BIL2. The second substrate SUB2 may be a base substrate or a base member. The second substrate SUB2 may be a flexible substrate that may be bent, folded, or rolled. For example, the second substrate SUB2 may include an insulating material such as a polymer resin, for example, polyimide PI, but is not limited thereto.

The display layer DPL may be disposed on the second substrate SUB2. The display layer DPL may include a thin film transistor layer TFTL, a light emitting element layer EML, a wavelength conversion layer WLCL, and a color filter layer CFL.

The thin film transistor layer TFTL may include a lower metal layer BML, a buffer layer BF, an active layer ACTL, a gate insulating layer GI, a gate electrode GE, an interlayer insulating layer ILD, a connection electrode CNE, a first passivation layer PV1, and a first planarization layer OC1.

The lower metal layer BML may be disposed on the second substrate SUB2. The lower metal layer BML may overlap the thin film transistor TFT in the thickness direction (Z-axis direction) to block external light incident on the thin film transistor TFT. As another example, the lower metal layer BML may include a data line or a power line. The lower metal layer BML may be formed of a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

The buffer layer BF may be disposed on the lower metal layer BML and the second substrate SUB2. The buffer layer BF may include an inorganic material capable of preventing permeation of air or moisture. For example, the buffer layer BF may include multiple inorganic films that may be alternately stacked on each other.

The active layer ACTL may be disposed on the buffer layer BF. The active layer ACTL may include a semiconductor area ACT, a drain electrode DE, and a source electrode SE of the thin film transistor TFT. The semiconductor area ACT may overlap the gate electrode GE in the thickness direction (Z-axis direction), and may be insulated from the gate electrode GE by the gate insulating layer GI. The drain electrode DE and the source electrode SE may be formed by making a material of the semiconductor area ACT into a conductor. The thin film transistor TFT may constitute a pixel circuit of each of the pixels. For example, the thin film transistor TFT may be a driving transistor or a switching transistor of the pixel circuit.

The gate insulating layer GI may be disposed on the active layer ACTL and the buffer layer BF. The gate insulating layer GI may insulate the semiconductor area ACT and the gate electrode GE of the thin film transistor TFT. The gate insulating layer GI may include a contact hole through which the connection electrodes CNE penetrate.

The gate electrode GE may be disposed on the gate insulating layer GI. The gate electrode GE may overlap the semiconductor area ACT with the gate insulating layer GI interposed therebetween. The gate electrode GE may receive a gate signal from a gate line. For example, the gate electrode GE may be formed of a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

The interlayer insulating layer ILD may be disposed on the gate electrode GE. The interlayer insulating layer ILD may insulate the gate electrode GE and the connection electrodes CNE. The interlayer insulating layer ILD may include a contact hole through which the connection electrodes CNE penetrate.

The connection electrodes CNE may be disposed on the interlayer insulating layer ILD. The connection electrodes CNE may include a first connection electrode CNE1 and a second connection electrode CNE2. The first connection electrode CNE1 and the second connection electrode CNE2 may be formed of the same material on the same layer, but are not limited thereto. For example, the first connection electrode CNE1 and the second connection electrode CNE2 may be formed of a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

The first connection electrode CNE1 may connect the data line or the power line to the drain electrode DE of the thin film transistor TFT. The first connection electrode CNE1 may be in contact with the drain electrode DE through the contact hole formed in the interlayer insulating layer ILD and the gate insulating layer GI. The second connection electrode CNE2 may connect the source electrode SE of the thin film transistor TFT to a first electrode RME1. The second connection electrode CNE2 may be in contact with the source electrode SE through the contact hole formed in the interlayer insulating layer ILD and the gate insulating layer GI.

The first passivation layer PV1 may be disposed on the connection electrodes CNE and the interlayer insulating layer ILD. The first passivation layer PV1 may protect the thin film transistor TFT. The first passivation layer PV1 may include a contact hole through which the first electrode RME1 penetrates.

The first planarization layer OC1 may be disposed on the first passivation layer PV1. The first planarization layer OC1 may planarize an upper portion of the thin film transistor layer TFTL. For example, the first planarization layer OC1 may include a contact hole through which the first electrode RME1 penetrates. The contact hole of the first planarization layer OC1 may be connected to the contact hole of the first passivation layer PV1. The first planarization layer OC1 may include an organic insulating material such as polyimide PI.

The light emitting element layer EML may be disposed on the thin film transistor layer TFTL. The light emitting element layer EML may include bank patterns BP, a first electrode RME1, a second electrode RME2, a first insulating layer PAS1, a sub-bank SB, a light emitting element ED, a second insulating layer PAS2, a first contact electrode CTE1, a second contact electrode CTE2, and a third insulating layer PAS3.

The bank patterns BP may be disposed on the first planarization layer OC1. The bank patterns BP may protrude from an upper surface of the first planarization layer OC1. The bank patterns BP may extend in the second direction (Y-axis direction) and may be disposed to be spaced apart from each other in the first direction (X-axis direction). The bank patterns BP may be disposed in a light emitting area LA or an opening area of each of the pixels. Light emitting elements ED may be disposed between the bank patterns BP. The bank patterns BP may have inclined side surfaces, and light emitted from the light emitting elements ED may be reflected by the first and second electrodes RME1 and RME2 disposed on the bank patterns BP. For example, the bank patterns BP may include an organic insulating material such as polyimide PI.

The first electrode RME1 may be disposed on the first planarization layer OC1 and the bank patterns BP. The first electrode RME1 may be disposed on the bank pattern BP disposed on a side of the light emitting elements ED. The first electrode RME1 may be disposed on an inclined side surface of the bank pattern BP to reflect the light emitted from the light emitting elements ED. The first electrode RME1 may be inserted into the contact holes formed in the first planarization layer OC1 and the first passivation layer PV1 to be connected to the second connection electrode CNE2. The first electrode RME1 may be electrically connected to an end of the light emitting element ED through the first contact electrode CTE1. For example, the first electrode RME1 may receive a voltage proportional to luminance of the light emitting element ED from the thin film transistor TFT of the pixel.

The second electrode RME2 may be disposed on the first planarization layer OC1 and the bank pattern BP. The second electrode RME2 may be disposed on the bank pattern BP disposed on another side of the light emitting elements ED. The second electrode RME2 may be disposed on an inclined side surface of the bank pattern BP to reflect the light emitted from the light emitting elements ED. The second electrode RME2 may be electrically connected to another end of the light emitting element ED through the second contact electrode CTE2. For example, the second electrode RME2 may receive a low potential voltage supplied to all pixels from a low potential line.

The first and second electrodes RME1 and RME2 may include a conductive material having a high reflectivity. For example, the first and second electrodes RME1 and RME2 may include at least one of aluminum (Al), silver (Ag), copper (Cu), nickel (Ni), and lanthanum (La). As another example, the first and second electrodes RME1 and RME2 may include a material such as indium tin oxide (ITO), indium zinc oxide (IZO), or indium tin zinc oxide (ITZO). As still another example, the first and second electrodes RME1 and RME2 may include multiple layers having a transparent conductive material layer and a metal layer having a high reflectivity, or may include one layer including a transparent conductive material and a metal having a high reflectivity. The first and second electrodes RME1 and RME2 may have a stacked structure such as ITO/Ag/ITO, ITO/Ag/IZO, or ITO/Ag/ITZO/IZO.

The first insulating layer PAS1 may be disposed on the first planarization layer OC1 and the first and second electrodes RME1 and RME2. The first insulating layer PAS1 may insulate the first and second electrodes RME1 and RME2 from each other while protecting the first and second electrodes RME1 and RME2. The first insulating layer PAS1 may prevent the light emitting elements ED from being in direct contact with and damaged by the first and second electrodes RME1 and RME2 in a process of aligning the light emitting elements ED.

The sub-banks SB may be disposed to overlap the light blocking area BA on the first insulating layer PAS1. The sub-banks SB may be disposed at a boundary of the pixels to distinguish the pixels. The sub-banks SB may have a height and may include an organic insulating material such as polyimide PI.

The light emitting elements ED may be disposed on the first insulating layer PAS1. The light emitting elements ED may be aligned in parallel with each other between the first and second electrodes RME1 and RME2. A length of the light emitting element ED may be greater than a length between the first and second electrodes RME1 and RME2. The light emitting element ED may include multiple semiconductor layers, and an end of the light emitting element ED and another end of the light emitting element ED opposite to the end may be defined on the basis of any one semiconductor layer. An end of the light emitting element ED may be disposed on the first electrode RME1, and another end of the light emitting element ED may be disposed on the second electrode RME2. An end of the light emitting element ED may be electrically connected to the first electrode RME1 through the first contact electrode CTE1, and another end of the light emitting element ED may be electrically connected to the second electrode RME2 through the second contact electrode CTE2.

The light emitting element ED may have a size of a micro-meter or a nano-meter unit, and may be an inorganic light emitting diode including an inorganic material. The inorganic light emitting diodes may be aligned between the first and second electrodes RME1 and RME2 according to an electric field formed in a specific direction between the first and second electrodes RME1 and RME2 facing each other.

For example, the light emitting elements ED may include an active layer having the same material to emit light of the same wavelength band or light of the same color. Light emitted from each of the first to third light emitting areas LA1, LA2, and LA3 of the light emitting element layer EML may have the same color. For example, the light emitting elements ED may emit light of a third color or blue light having a peak wavelength in the range of 440 nm to 480 nm, but are not limited thereto.

The second insulating layer PAS2 may be disposed on the light emitting elements ED. For example, the second insulating layer PAS2 may partially surround the light emitting elements ED and may not cover both ends of each of the light emitting elements ED. The second insulating layer PAS2 may protect the light emitting elements ED and may fix the light emitting elements ED in the process of manufacturing the display device 10. The second insulating layer PAS2 may fill a space between the light emitting element ED and the first insulating layer PAS1.

The first contact electrode CTE1 may be disposed on the first insulating layer PAS1, and may be inserted into a contact hole formed in the first insulating layer PAS1 to be connected to the first electrode RME1. For example, the contact hole of the first insulating layer PAS1 may be formed on the bank pattern BP, but is not limited thereto. An end of the first contact electrode CTE1 may be connected to the first electrode RME1 on the bank pattern BP, and another end of the first contact electrode CTE1 may be connected to an end of the light emitting element ED.

The second contact electrode CTE2 may be disposed on the first insulating layer PAS1, and may be inserted into a contact hole formed in the first insulating layer PAS1 to be connected to the second electrode RME2. For example, the contact hole of the first insulating layer PAS1 may be provided on the bank pattern BP, but is not limited thereto. An end of the second contact electrode CTE2 may be connected to another end of the light emitting element ED, and another end of the second contact electrode CTE2 may be connected to the second electrode RME2 on the bank pattern BP.

The third insulating layer PAS3 may be disposed on the first and second contact electrodes CTE1 and CTE2, the sub-bank SB, and the first and second insulating layers PAS1 and PAS2. The third insulating layer PAS3 may be disposed on the light emitting element layer EML to protect the light emitting element layer EML.

The wavelength conversion layer WLCL may be disposed on the light emitting element layer EML. The wavelength conversion layer WLCL may include a first light blocking member BK1, a first wavelength conversion portion WLC1, a second wavelength conversion portion WLC2, a light transmission portion LTU, a second passivation layer PV2, and a second planarization layer OC2.

The first light blocking member BK1 may be disposed on the third insulating layer PAS3 and may be disposed to overlap the light blocking area BA. The first light blocking member BK1 may overlap the sub-bank SB in the thickness direction (Z-axis direction). The first light blocking member BK1 may block transmission of light. The first light blocking member BK1 may prevent the light from permeating between the first to third light emitting areas LA1, LA2, and LA3 and mixing colors with each other to improve a color reproduction rate of the display device 10. The first light blocking member BK1 may be disposed in a lattice shape surrounding the first to third light emitting areas LA1, LA2, and LA3 in plan view.

The first wavelength conversion portion WLC1 may be disposed on the third insulating layer PAS3 and may be disposed to overlap the first light emitting area LA1. The first wavelength conversion portion WLC1 may be surrounded by the first light blocking member BK1. The first wavelength conversion portion WLC1 may include a first base resin BS1, a first scatterer SCT1, and a first wavelength shifter WLS1.

The first base resin BS1 may include a material having a relatively high light transmittance. The first base resin BS1 may be made of a transparent organic material. For example, the first base resin BS1 may include at least one of an organic material such as an epoxy-based resin, an acrylic resin, a cardo-based resin, and an imide-based resin.

The first scatterer SCT1 may have a refractive index different from that of the first base resin BS1, and may form an optical interface with the first base resin BS1. For example, the first scatterer SCT1 may include a light scattering material or a light scattering particle scattering at least a portion of transmitted light. For example, the first scatterer SCT1 may include a metal oxide such as titanium oxide $(TiO_2)$, zirconium oxide $(ZrO_2)$, aluminum oxide $(Al_2O_3)$, indium oxide $(In_2O_3)$, zinc oxide $(ZnO)$, or tin oxide $(SnO_2)$, or may include organic particles such as an acrylic resin or a urethane resin. The first scatterer SCT1 may scatter light in a random direction regardless of an incident direction of incident light without substantially converting a peak wavelength of the incident light.

The first wavelength shifter WLS1 may convert or shift the peak wavelength of the incident light to a first peak wavelength. For example, the first wavelength shifter WLS1 may convert blue light provided from the display device 10 into red light having a single peak wavelength in the range of 610 nm to 650 nm and emit the red light. The first wavelength shifter WLS1 may be a quantum dot, a quantum rod, or a phosphor. The quantum dot may be a particulate matter that emits a specific color as electrons transition from a conduction band to a valence band.

A portion of the blue light provided from the light emitting element layer EML may be transmitted through the first wavelength conversion portion WLC1 without being converted into the red light by the first wavelength shifter WLS1. Light incident on a first color filter CF1 without being converted by the first wavelength conversion portion WLS1 in the blue light provided from the light emitting element layer EML may be blocked by the first color filter CF1. The red light converted by the first wavelength conversion portion WLC1 in the blue light provided from the light emitting element layer EML may be transmitted through the first color filter CF1 and emitted to the outside. Accordingly, the first light emitting area LA1 may emit the red light.

The second wavelength conversion portion WLC2 may be disposed on the third insulating layer PAS3 and may be disposed to overlap the second light emitting area LA2. The second wavelength conversion portion WLC2 may be surrounded by the first light blocking member BK1. The second wavelength conversion portion WLC2 may include a second base resin BS2, a second scatterer SCT2, and a second wavelength shifter WLS2.

The second base resin BS2 may include a material having a relatively high light transmittance. The second base resin BS2 may be made of a transparent organic material. For example, the second base resin BS2 may be made of the same material as the first base resin BS1 or be made of the material listed as an example with respect to the first base resin BS1.

The second scatterer SCT2 may have a refractive index different from that of the second base resin BS2, and may form an optical interface with the second base resin BS2. For example, the second scatterer SCT2 may include a light scattering material or a light scattering particle scattering at least a portion of transmitted light. For example, the second scatterer SCT2 may be made of the same material as the first scatterer SCT1 or be made of the material listed as an example with respect to the first scatterer SCT1.

The second wavelength shifter WLS2 may convert or shift the peak wavelength of the incident light to a second peak wavelength different from the first peak wavelength of the first wavelength shifter WLS1. For example, the second wavelength shifter WLS2 may convert the blue light provided from the display device 10 into green light having a single peak wavelength in the range of 510 nm to 550 nm and emit the green light. The second wavelength shifter WLS2 may be a quantum dot, a quantum rod, or a phosphor. The second wavelength shifter WLS2 may include the material listed as an example with respect to the first wavelength shifter WLS1. The second wavelength shifter WLS2 may be made of the quantum dot, the quantum rod, or the phosphor so that a wavelength conversion range of the second wavelength shifter WLS2 may be different from a wavelength conversion range of the first wavelength shifter WLS1.

The light transmission portion LTU may be disposed on the third insulating layer PAS3 and may be disposed to overlap the third light emitting area LA3. The light transmission portion LTU may be surrounded by the first light blocking member BK1. The light transmission portion LTU may transmit incident light therethrough while maintaining a peak wavelength of the incident light. The light transmission portion LTU may include a third base resin BS3 and a third scatterer SCT3.

The third base resin BS3 may include a material having a relatively high light transmittance. The third base resin BS3 may be made of a transparent organic material. For example, the third base resin BS3 may be made of the same material as the first or second base resin BS1 or BS2 or be made of the material listed as an example with respect to the first base resin BS1.

The third scatterer SCT3 may have a refractive index different from that of the third base resin BS3, and may form an optical interface with the third base resin BS3. For example, the third scatterer SCT3 may include a light scattering material or a light scattering particle scattering at least a portion of transmitted light. For example, the third scatterer SCT3 may be made of the same material as the first or second scatterer SCT1 or SCT2 or be made of the material listed as an example with respect to the first scatterer SCT1.

Since the wavelength conversion layer WLCL may be disposed on (e.g., directly disposed on) the third insulating layer PAS3 of the light emitting element layer EML, the display device 10 may not require a separate substrate for the first and second wavelength conversion portions WLC1 and WLC2 and the light transmission portion LTU. Therefore, the first and second wavelength conversion portions WLC1 and WLC2 and the light transmission portion LTU may be readily aligned with the first to third light emitting areas LA1, LA2, and LA3, respectively, and a thickness of the display device 10 may be relatively reduced.

The second passivation layer PV2 may cover the first and second wavelength conversion portions WLC1 and WLC2, the light transmission portion LTU, and the first light blocking member BK1. For example, the second passivation layer PV2 may seal the first and second wavelength conversion portions WLC1 and WLC2 and the light transmission portion LTU to prevent damage or contamination of the first and second wavelength conversion portions WLC1 and WLC2 and the light transmission portion LTU. For example, the second passivation layer PV2 may include an inorganic material.

The second planarization layer OC2 may be disposed on the second passivation layer PV2 to planarize upper portions of the first and second wavelength conversion portions WLC1 and WLC2 and the light transmission portion LTU. For example, the second planarization layer OC2 may include an organic insulating material such as polyimide PI.

The color filter layer CFL may be disposed on the wavelength conversion layer WLCL. The color filter layer CFL may include a second light blocking member BK2, first to third color filters CF1, CF2, and CF3, and a third passivation layer PV3.

The second light blocking member BK2 may be disposed on the second planarization layer OC2 of the wavelength conversion layer WLCL and may be disposed to overlap the light blocking area BA. The second light blocking member BK2 may overlap the first light blocking member BK1 or the sub-bank SB in the thickness direction (Z-axis direction). The second light blocking member BK2 may block transmission of light. The second light blocking member BK2 may prevent the light from permeating between the first to third light emitting areas LA1, LA2, and LA3 and mixing colors with each other to improve a color reproduction rate of the display device 10. The second light blocking member BK2 may be disposed in a lattice shape surrounding the first to third light emitting areas LA1, LA2, and LA3 in plan view.

The first color filter CF1 may be disposed on the second planarization layer OC2 and may be disposed to overlap the first light emitting area LA1. The first color filter CF1 may be surrounded by the second light blocking member BK2. The first color filter CF1 may overlap the first wavelength conversion portion WLC1 in the thickness direction (Z-axis direction). The first color filter CF1 may selectively transmit light of a first color (e.g., red light), and block or absorb light of a second color (e.g., green light) and light of a third color (e.g., blue light). For example, the first color filter CF1 may be a red color filter and include a red colorant.

The second color filter CF2 may be disposed on the second planarization layer OC2 and may be disposed to overlap the second light emitting area LA2. The second color filter CF2 may be surrounded by the second light blocking member BK2. The second color filter CF2 may overlap the second wavelength conversion portion WLC2 in the thickness direction (Z-axis direction). The second color filter CF2 may selectively transmit the light of the second color (e.g., the green light), and block or absorb the light of the first color (e.g., the red light) and the light of the third color (e.g., the blue light). For example, the second color filter CF2 may be a green color filter and include a green colorant.

The third color filter CF3 may be disposed on the second planarization layer OC2 and may be disposed to overlap the third light emitting area LA3. The third color filter CF3 may be surrounded by the second light blocking member BK2. The third color filter CF3 may overlap the light transmission portion LTU in the thickness direction (Z-axis direction). The third color filter CF3 may selectively transmit the light of the third color (e.g., the blue light), and block or absorb the light of the first color (e.g., the red light) and the light of the second color (e.g., the green light). For example, the third color filter CF3 may be a blue color filter and include a blue colorant.

The first to third color filters CF1, CF2, and CF3 may absorb a portion of light introduced from the outside of the display device 10 to reduce reflected light due to external light. Therefore, the first to third color filters CF1, CF2, and CF3 may prevent color distortion due to reflection of the external light.

Since the first to third color filters CF1, CF2, and CF3 may be disposed on (e.g., directly disposed on) the second planarization layer OC2 of the wavelength conversion layer WLCL, the display device 10 may not require a separate substrate for the first to third color filters CF1, CF2, and CF3. Therefore, a thickness of the display device 10 may be relatively reduced.

The third passivation layer PV3 may cover the first to third color filters CF1, CF2, and CF3. The third passivation layer PV3 may protect the first to third color filters CF1, CF2, and CF3.

The encapsulation layer TFE may be disposed on the third passivation layer PV3 of the color filter layer CFL. The encapsulation layer TFE may cover an upper surface and side surfaces of the display layer DPL. For example, the encapsulation layer TFE may include at least one inorganic film to prevent permeation of oxygen or moisture. The encapsulation layer TFE may include at least one organic film to protect the display device 10 from foreign matters such as dust.

The anti-reflection film ARF may be disposed on the encapsulation layer TFE. The anti-reflection film ARF may prevent the reflection of the external light to suppress a decrease in visibility due to the reflection of the external light. The anti-reflection film ARF may protect an upper surface of the display device 10. Optionally, the anti-reflection film ARF may be omitted. As another example, the anti-reflection film ARF may be replaced with a polarizing film.

The flexible film FPCB may be disposed on a lower side of the first substrate SUB1. The flexible film FPCB may be attached to a lower surface of the first substrate SUB1 using an adhesive member ADM. Optionally, the adhesive member ADM may be omitted. The flexible film FPCB may support the display driver DIC disposed on another side of a lower surface thereof. A film pad PAE may be disposed on a surface of the flexible film FPCB, for example, a surface facing the first substrate SUB1. The film pad PAE of the flexible film FPCB may be electrically connected to the pad electrode PD through the connection film ACF. Another side of the flexible film FPCB may be connected to a source circuit board (not illustrated) on a lower side of the first substrate SUB1. The flexible film FPCB may transmit a signal of the display driver DIC to the display device 10.

The display driver DIC may be an integrated circuit (IC). For example, the display driver DIC may convert a digital video data into an analog data voltage based on a data control signal of a timing controller and may supply the digital video data to the data line of the display area DA through the flexible film FPCB. As another example, the display driver DIC may generate a gate signal based on a gate control signal of the timing controller and may supply the gate signal to the gate line of the display area DA through the flexible film FPCB. The display device 10 may include the flexible film FPCB and the display driver DIC disposed on the lower side of the first substrate SUB1, thereby minimizing an area of the non-display area NDA.

Hereinafter, a method of manufacturing the display device 10 described above will be described with reference to other drawings.

FIGS. 7 to 16 are schematic views illustrating a method of manufacturing a display device according to an embodiment for each process.

Figure 7:
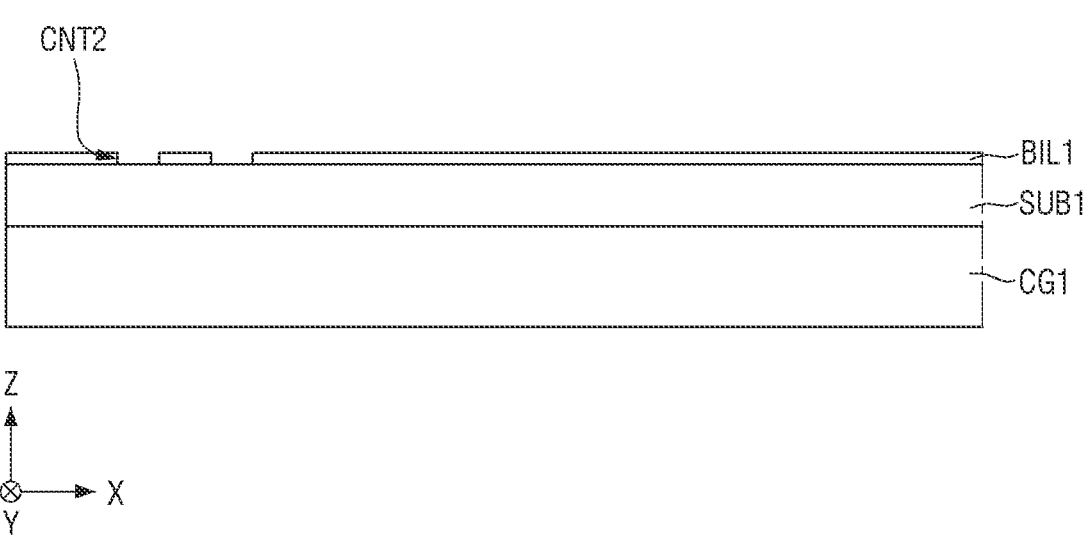
FIGS. 7 to 16 are schematic views illustrating a method of manufacturing a display device according to an embodiment for each process.

Referring to FIG. 7, a first carrier substrate CG1 may be prepared. The first carrier substrate CG1 may support the display device 10 in the process of manufacturing the display device 10. For example, the first carrier substrate CG1 may be a glass substrate, but is not limited thereto.

A first substrate SUB1 may be formed on the first carrier substrate CG1. The first substrate SUB1 may be formed by applying an insulating material such as a polymer resin, for example, polyimide PI through a solution process. The first substrate SUB1 may be a base substrate or a base member. A first barrier insulating layer BIL1 may be formed on the first substrate SUB1. The first barrier insulating layer BIL1 may be formed by stacking an inorganic material capable of preventing permeation of air or moisture.

Second contact holes CNT2 may be formed in the first barrier insulating layer BIL1. The second contact holes CNT2 may be formed using a dry etching process. The second contact holes CNT2 may penetrate through the first barrier insulating layer BIL1 and expose an upper surface of the first substrate SUB1.

Figure 8:
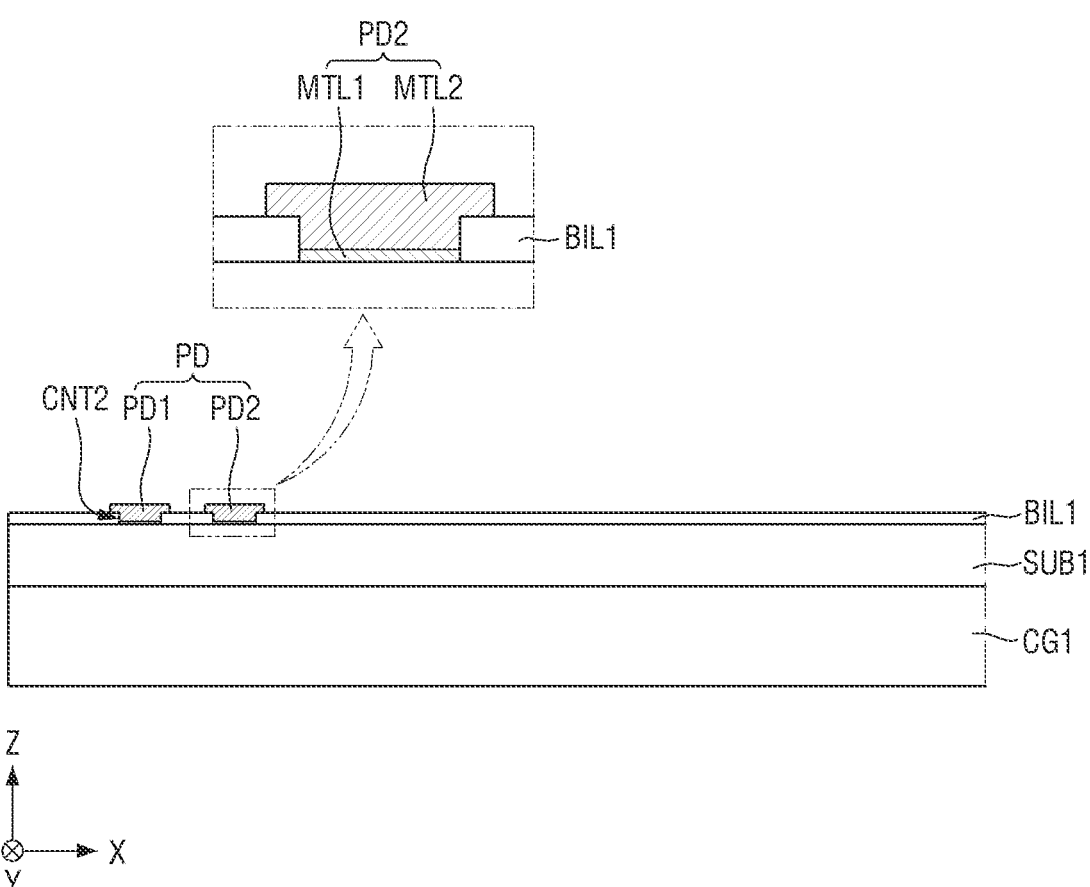

Referring to FIG. 8, pad electrodes PD may be formed. A first metal layer material and a second metal layer material may be sequentially stacked on each other and batch etched to form a first metal layer MTL1 and a second metal layer MTL2 of the pad electrodes PD. The pad electrodes PD may be formed as a first pad electrode PD1 and a second pad electrode PD2 in the second contact holes CNT2. According to an embodiment, the first metal layer MTL1 may be disposed on a lower side of an upper surface of the first barrier insulating layer BIL1, and the second metal layer MTL2 may have a lower surface disposed on the lower side of the upper surface of the first barrier insulating layer BIL1 and an upper surface disposed on an upper side of the upper surface of the first barrier insulating layer BIL1.

Figure 9:
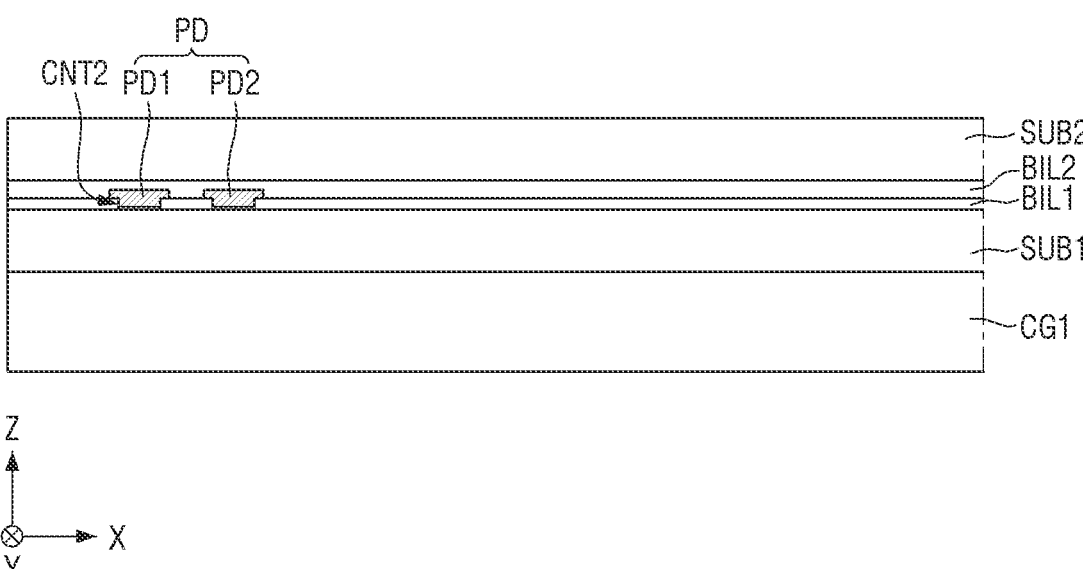

Referring to FIG. 9, a second barrier insulating layer BIL2 may be formed on the first barrier insulating layer BIL1 and the pad electrodes PD. The second barrier insulating layer BIL2 may be formed in the same process as the first barrier insulating layer BIL1 described above, and may include an inorganic material capable of preventing permeation of air or moisture. A second substrate SUB2 may be formed on the second barrier insulating layer BIL2. The second substrate SUB2 may be formed in the same process as the first substrate SUB1 described above and may be formed of the same material as the first substrate SUB1.

Figure 10:
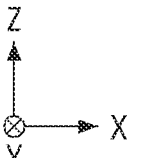

Referring to FIG. 10, a display layer DPL may be formed on the second substrate SUB2. The display layer DPL may have a thin film transistor layer TFTL, a light emitting element layer EML, a wavelength conversion layer WLCL, and a color filter layer CFL that may be sequentially stacked on each other on the second substrate SUB2. An encapsulation layer TFE may be formed to cover an upper surface and side surfaces of the display layer DPL, and an anti-reflection film ARF may be formed on the encapsulation layer TFE.

Figure 11:
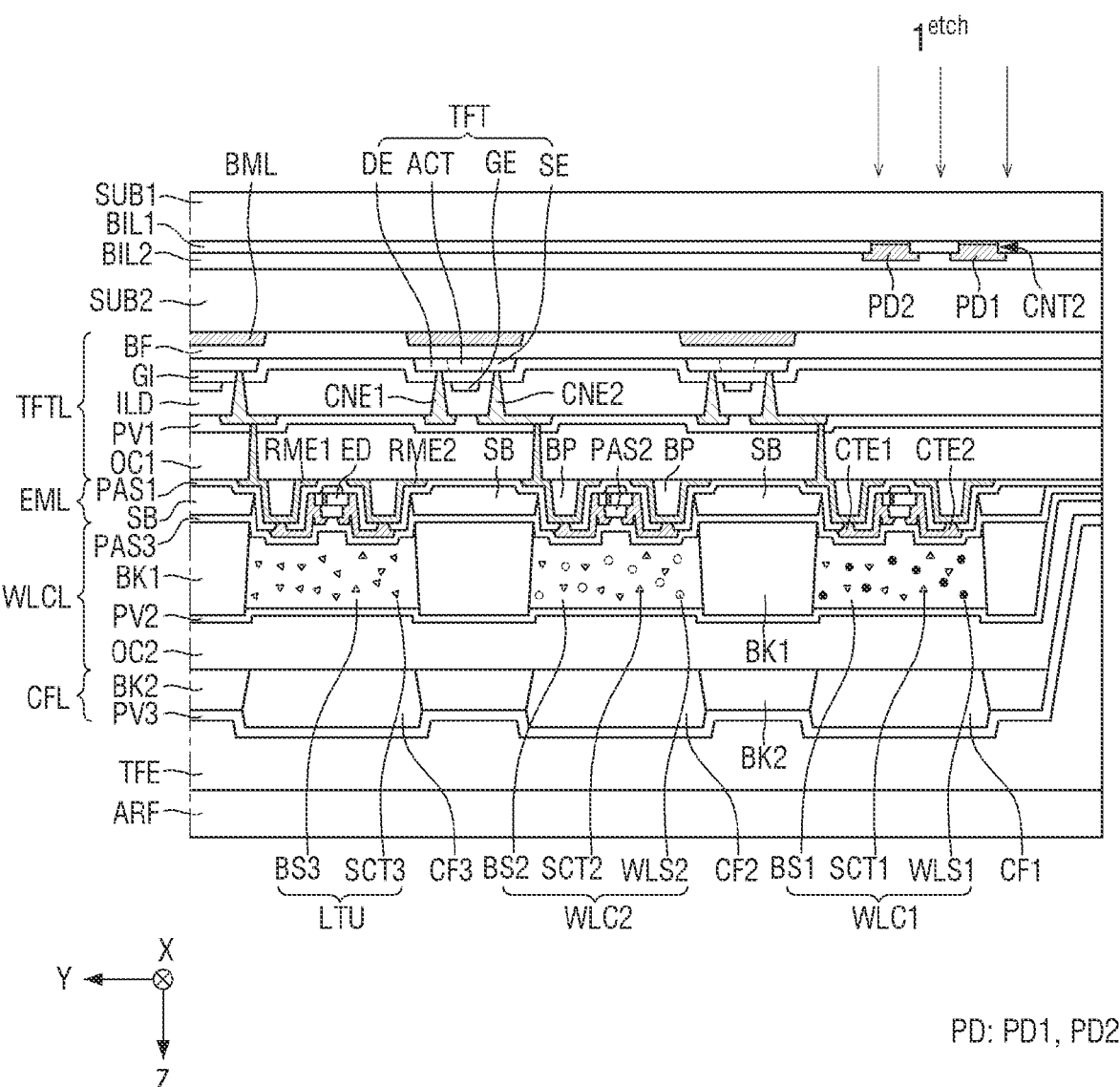
Figure 12:
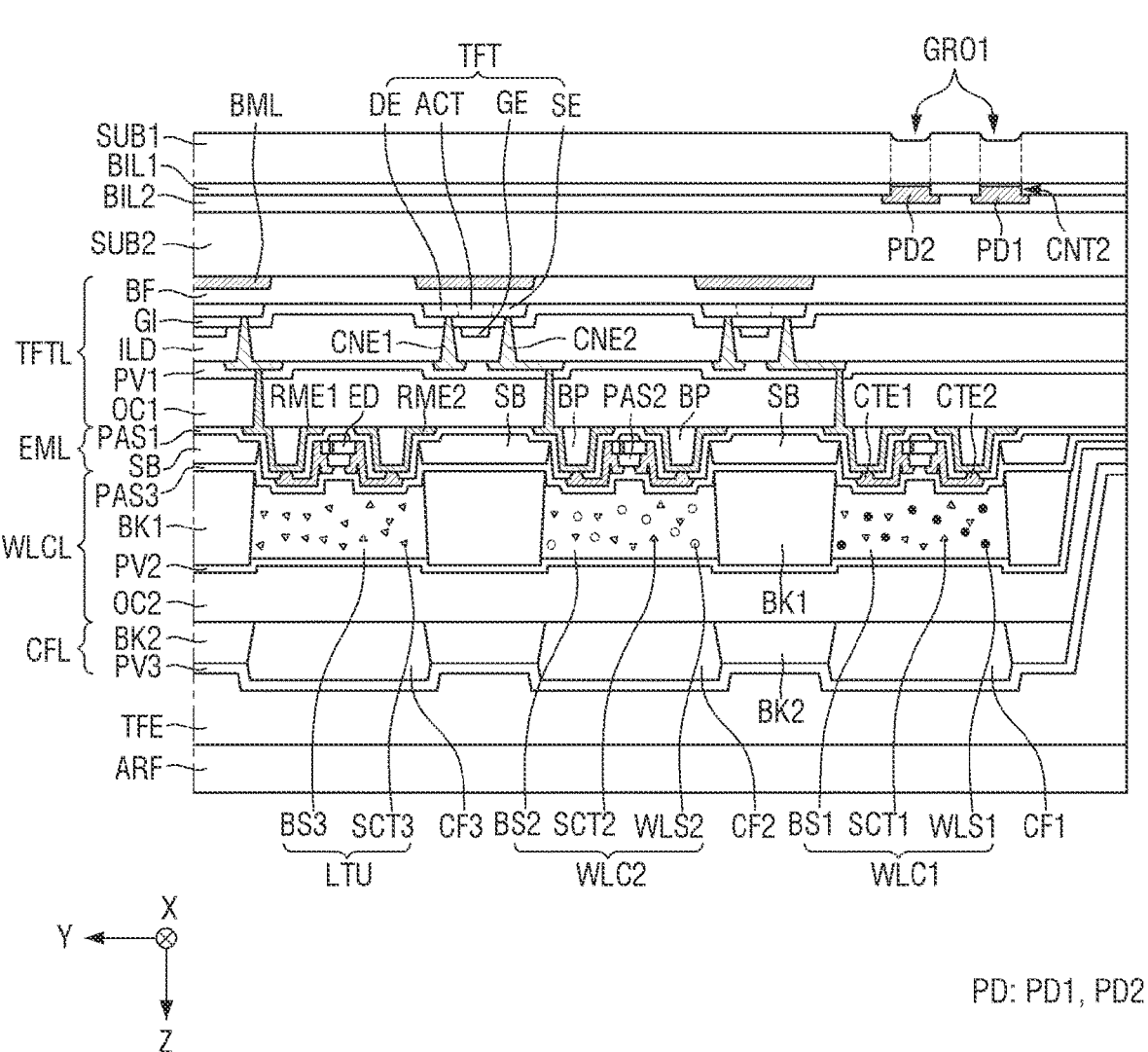

Referring to FIGS. 11 and 12, the display device 10 may be vertically inverted to form a flexible film FPCB, and the first carrier substrate CG1 may be removed from the first substrate SUB1. The first carrier substrate CG1 may be removed from a lower surface (e.g. upper surface if inverted) of the first substrate SUB1 by using a sacrificial layer (not illustrated) disposed between the first carrier substrate CG1 and the first substrate SUB1, but is not limited thereto.

A first etching ($1^{etch}$) may be performed on a surface of the first substrate SUB1 to form first grooves GRO1 in the first substrate SUB1. The first etching ($1^{etch}$) may be performed by at least one of a dry etching process, a plasma etching process, and a laser etching process. For example, the first grooves GRO1 of the first substrate SUB1 may be etched through a pulse laser etching process. The pulse laser etching may use a laser wavelength of 190 nm to 360 nm. A power of the pulse laser etching may be 0.4 W to 30 W, a laser spot size may be 20 μm to 200 μm, a pulse width may be 0.1 to 20 pico second (ps), and a repetition rate may be 50 kHz to 2000 kHz. In an embodiment, the pulse laser etching may be performed under the conditions of the wavelength of 355 nm, the power of 20 W, the spot size of 150 μm, the pulse width of 15 ps, and the repetition rate of 800 kHz. However, the disclosure is not limited thereto.

The first grooves GRO1 may be formed on a surface of the first substrate SUB1 by using the pulse laser etching described above. The first grooves GRO1 may be formed to be concave to a depth from a surface of the first substrate SUB1. The first grooves GRO1 may be disposed to overlap the second contact holes CNT2 of the first barrier insulating layer BIL1, respectively, and may be aligned with the second contact holes CNT2 in the thickness direction (Z-axis direction), respectively. The first grooves GRO1 may be disposed to be spaced apart from each other in the first direction (X-axis direction).

Figure 13:
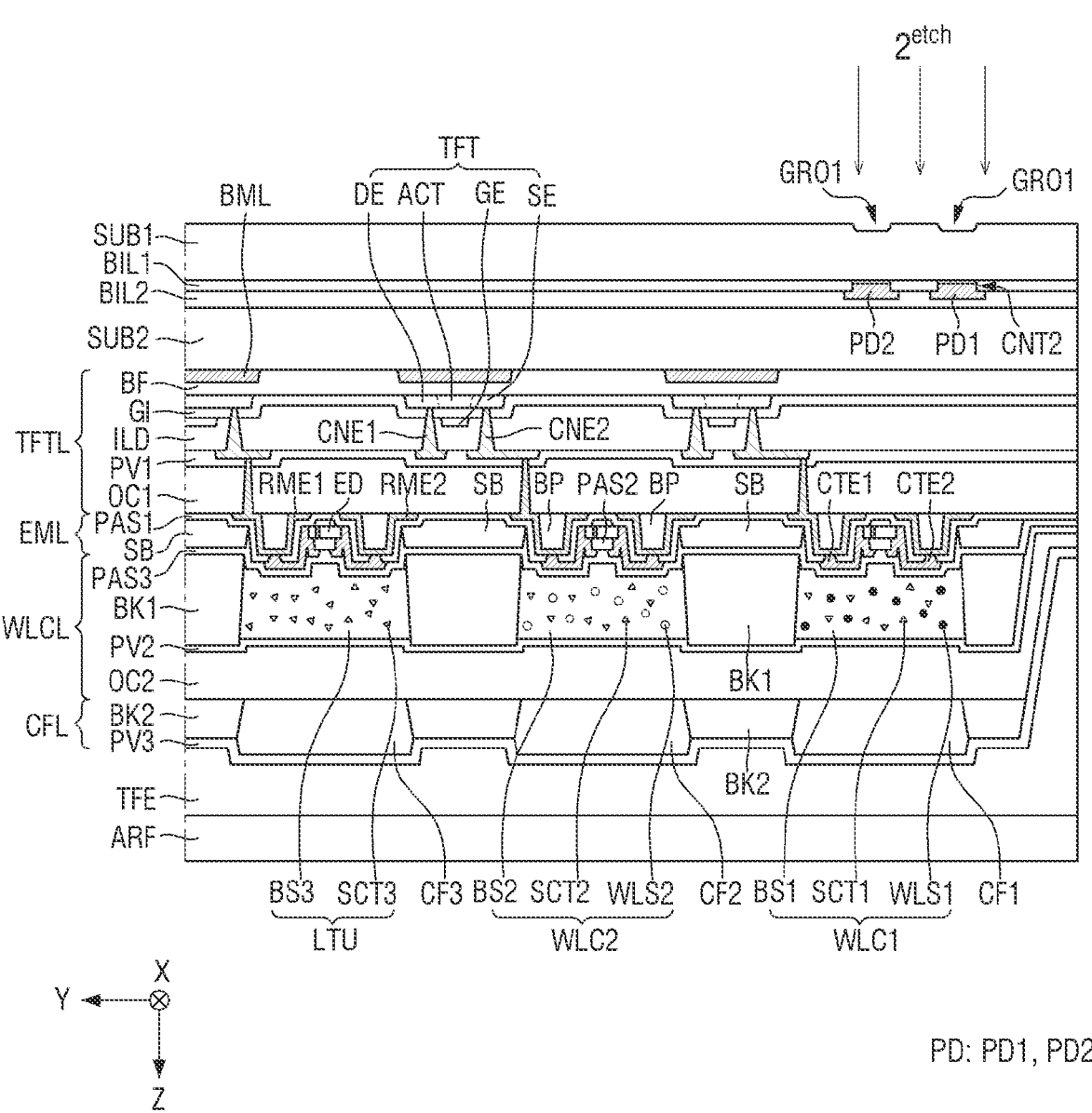
Figure 14:
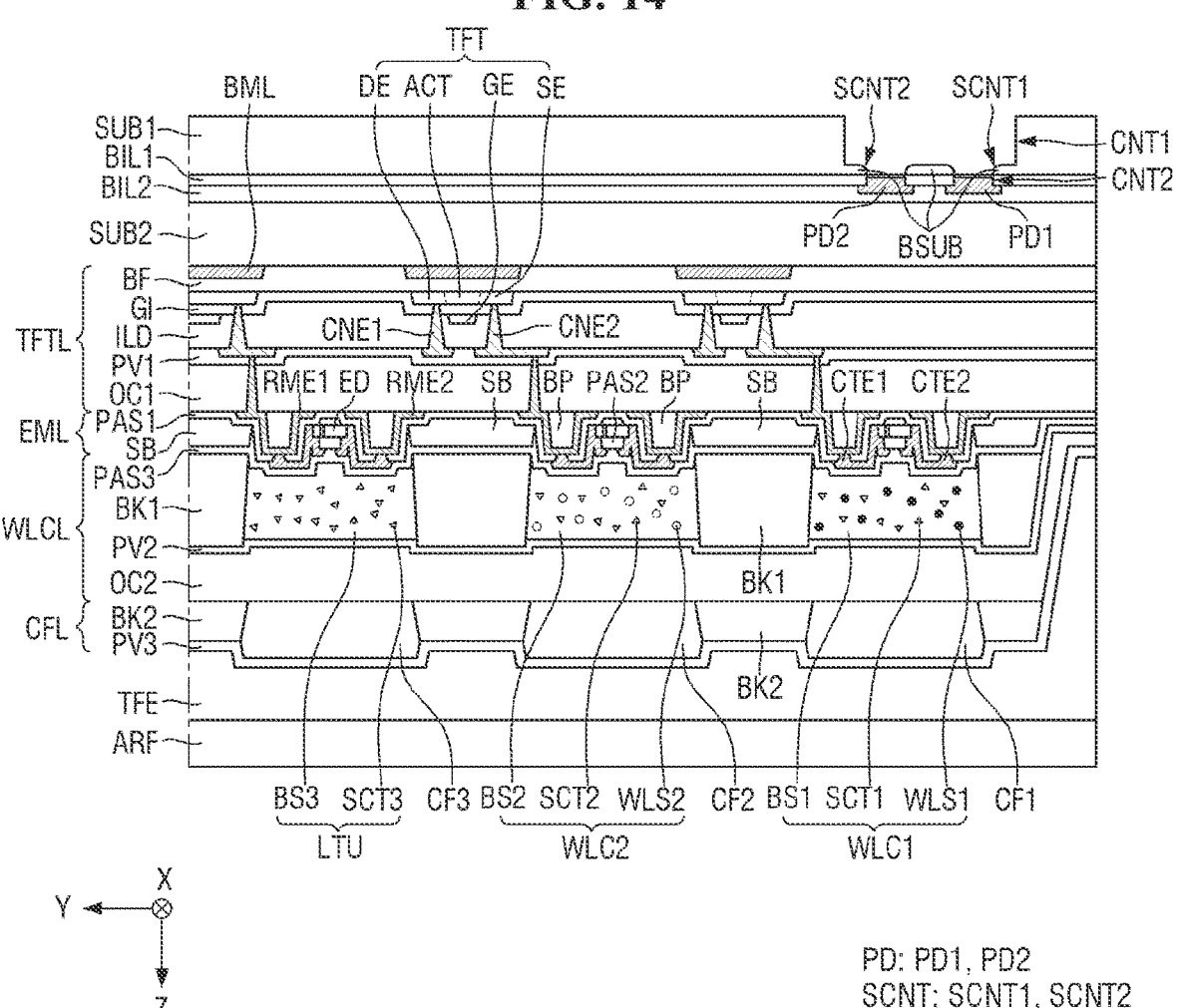

Referring to FIGS. 13 and 14, a second etching ($2^{etch}$) may be performed on a surface of the first substrate SUB1 to form a first contact hole CNT1 and sub-contact holes SCNT. The first contact hole CNT1 may be formed in the first substrate SUB1 in an area including the first grooves GRO1 using pulse laser etching. The second etching ($2^{etch}$) may use the same pulse laser etching as that of the first etching ($1^{etch}$) described above, and may be performed within the process conditions of the first etching ($1^{etch}$).

During the second etching ($2^{etch}$) the first substrate SUB1 may be etched to the same thickness and removed, and in case that the pad electrodes PD are exposed, the etching may be terminated. The area of the first substrate SUB1 in which the first grooves GRO1 may be formed may be etched to form the sub-contact holes SCNT, thereby exposing the pad electrodes PD. For example, a first sub-contact hole SCNT1 exposes the first pad electrode PD1 and a second sub-contact hole SCNT2 exposes the second pad electrode PD2. The first substrate SUB1 in the area other than the first grooves GRO1 may not be completely etched and remain, and may be formed as a substrate buffer portion B SUB. According to an embodiment, in case that the pad electrodes PD are exposed during the second etching ($2^{etch}$) and a laser irradiation may be terminated, the substrate buffer portion BSUB may be formed in an area other than the pad electrodes PD, which may prevent the second substrate SUB2 from being irradiated with the laser. For example, the substrate buffer portion BSUB may serve to protect the second substrate SUB2 so that the laser may no longer be transmitted therethrough. Therefore, according to an embodiment, it may be possible to prevent the second substrate SUB2 from being damaged by the second etching ($2^{etch}$) process through the substrate buffer portion BSUB.

Figure 15:
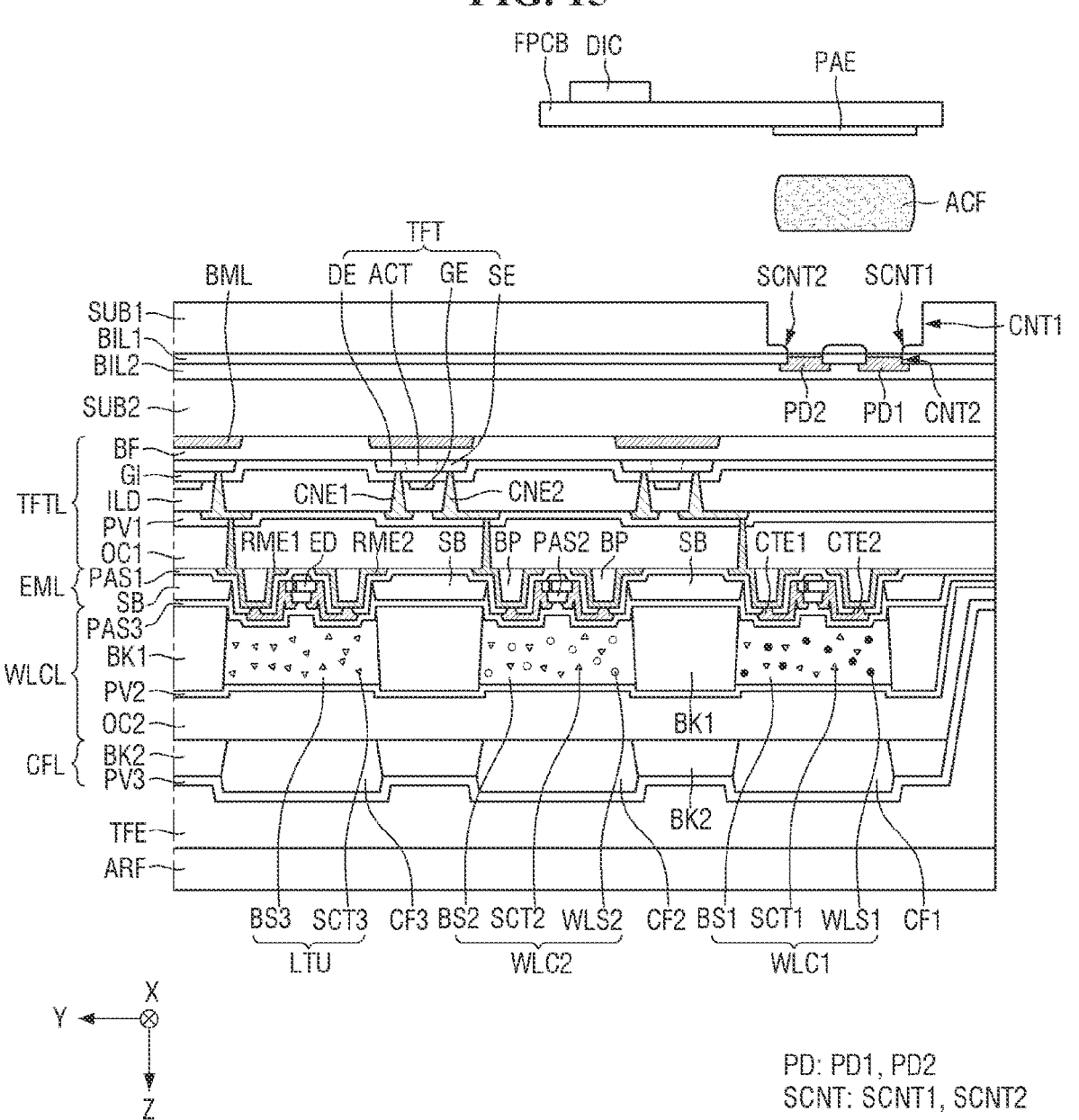
Figure 16:
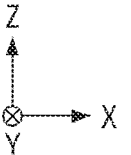

Referring to FIGS. 15 and 16, a flexible film FPCB may be prepared. A display driver DIC may be disposed on a surface of the flexible film FPCB and a film pad PAE may be disposed on another surface of the flexible film FPCB. The flexible film FPCB may be aligned on a surface of the first substrate SUB1, and may be aligned such that the film pad PAE faces the first substrate SUB1. The film pad PAE of the flexible film FPCB and the pad electrodes PD may be connected using a connection film ACF. The film pad PAE of the flexible film FPCB may be electrically connected to the pad electrode PD through the connection film ACF.

The flexible film FPCB may be attached and fixed to a surface of the first substrate SUB1 using an adhesive member ADM. However, the disclosure is not limited thereto, and the adhesive member ADM may be omitted. Accordingly, the display device 10 according to an embodiment may be manufactured.

Figure 17:
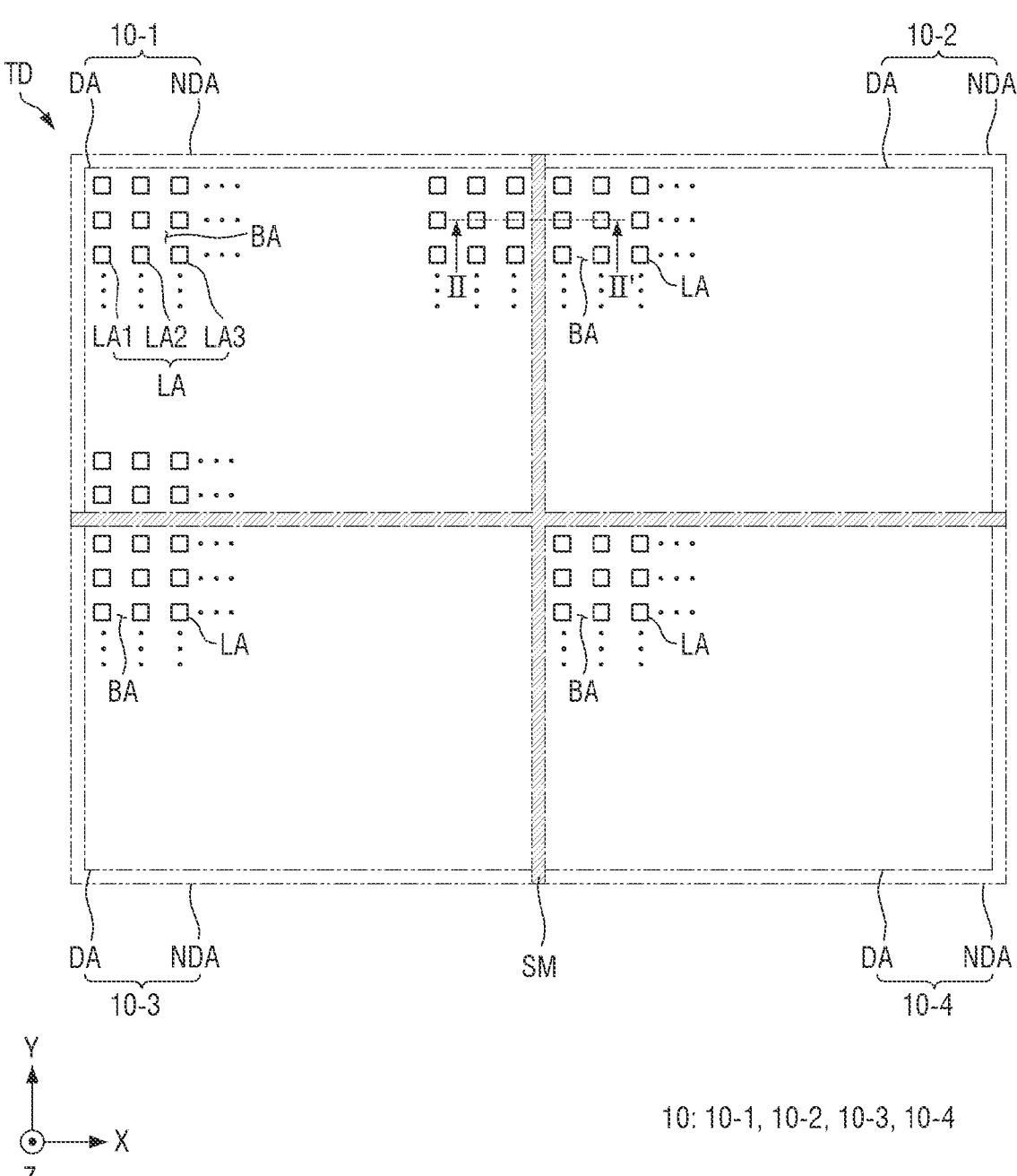
FIG. 17 is a schematic plan view illustrating a coupling structure of the tiled display device according to an embodiment.
Figure 18:
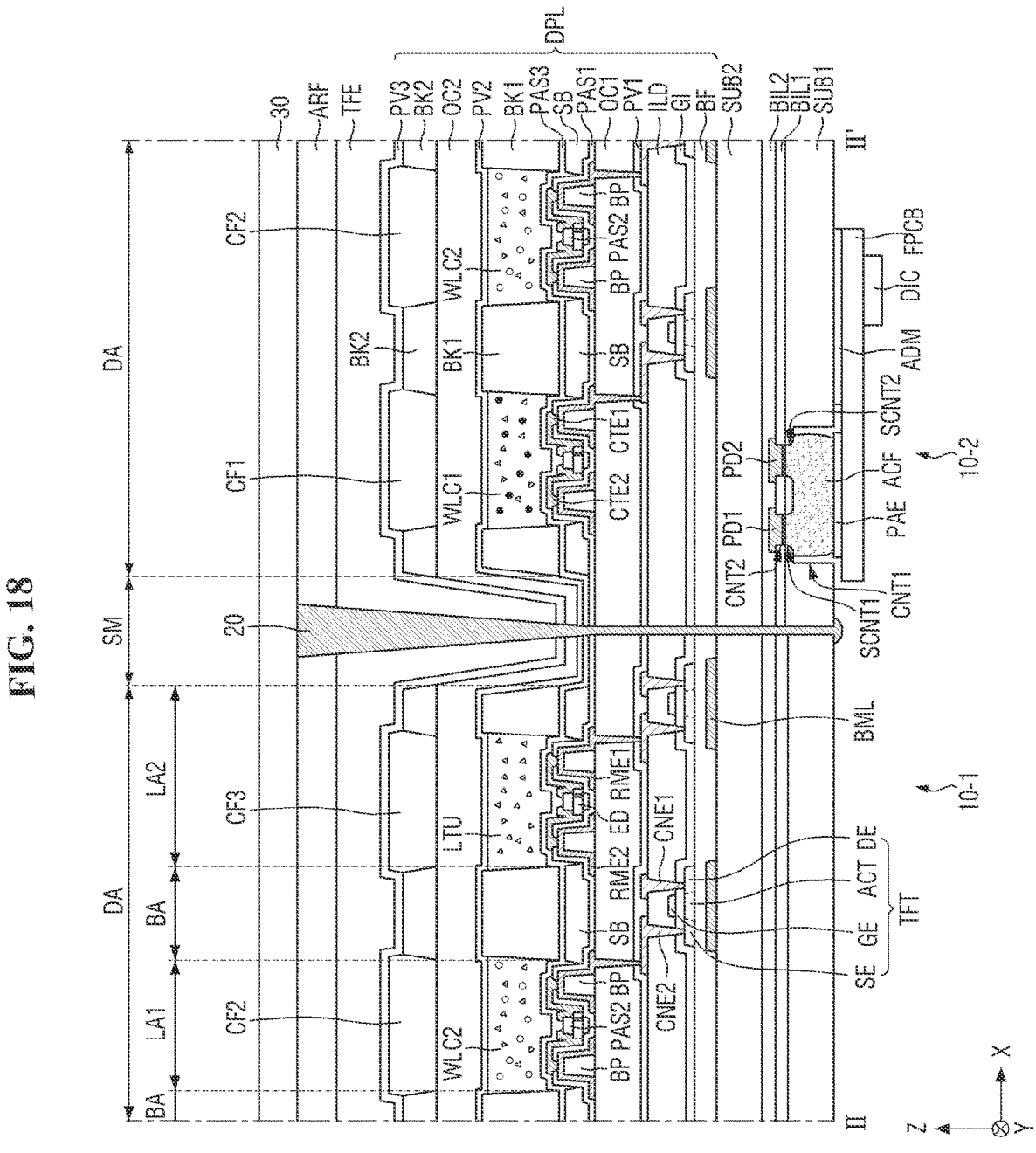
FIG. 18 is a schematic cross-sectional view taken along line II-II' of FIG. 17.

FIG. 17 is a schematic plan view illustrating a coupling structure of the tiled display device according to an embodiment. FIG. 18 is a schematic cross-sectional view taken along line II-II' of FIG. 17.

Referring to FIGS. 17 and 18, a tiled display device TD may include multiple display devices 10, a coupling member 20, and a cover member 30. The display devices 10 may be arranged in a lattice shape, but are not limited thereto. The display devices 10 may be connected in a first direction (X-axis direction) or a second direction (Y-axis direction), and the tiled display device TD may have a specific shape. For example, each of the display devices 10 may have the same size, but are not limited thereto. As another example, the display devices 10 may have different sizes.

The tiled display device TD may include first to fourth display devices 10-1 to 10-4. The number of display devices 10 and a coupling relationship between the display devices 10 are not limited to an embodiment of FIG. 17. The number of display devices 10 may be determined according to a size of each of the display device 10 and the tiled display device TD. For example, the tiled display device TD may include the display device 10 illustrated in FIG. 3.

The display device 10 may include a display area DA and a non-display area NDA. The display area DA may include pixels to display an image. The non-display area NDA may be disposed around the display area DA to surround the display area DA, and may not display an image.

The tiled display device TD may include a coupling area SM disposed between the display areas DA. The tiled display device TD may be formed by connecting the non-display areas NDA of each of adjacent display devices 10 to each other. The display devices 10 may be connected to each other through a coupling member 20 or an adhesive member disposed in the coupling area SM. The coupling area SM of each of the display devices 10 may not include a flexible film. Therefore, a distance between the display areas DA of each of the display devices 10 may be so small that the coupling area SM between the display devices 10 may not be recognized by the user. An external light reflectivity of the display area DA of each of the display devices 10 may be substantially the same as an external light reflectivity of the coupling area SM between the display devices 10. Therefore, the tiled display device TD may remove a sense of discontinuity between the display devices 10 and improve a degree of immersion of an image by preventing the coupling area SM between the display devices 10 from being recognized by the user.

The display device 10 may include pixels arranged along rows and columns in the display area DA. Each of the pixels may include a light emitting area LA defined by a pixel defining layer or a bank, and may emit light having a peak wavelength through the light emitting area LA. For example, the display area DA of the display device 10 may include first to third light emitting areas LA1, LA2, and LA3. Each of the first to third light emitting areas LA1, LA2, and LA3 may be an area in which light generated by a light emitting element of the display device 10 may be emitted to the outside of the display device 10.

The first to third light emitting areas LA1, LA2, and LA3 may be sequentially and repeatedly disposed along the first direction (X-axis direction) of the display area DA. For example, an area of the third light emitting area LA3 may be greater than that of the first light emitting area LA1, and the area of the first light emitting area LA1 may be greater than that of the second light emitting area LA2. As another example, the area of the first light emitting area LA1, the area of the second light emitting area LA2, and the area of the third light emitting area LA3 may be substantially the same.

The display area DA of the display device 10 may include a light blocking area BA surrounding the light emitting areas LA. The light blocking area BA may prevent color mixing of light emitted from the first to third light emitting areas LA1, LA2, and LA3.

In the tiled display device TD, side surfaces of the display devices 10 adjacent to each other may be coupled to each other using the coupling member 20 disposed between the display devices 10. The coupling member 20 may connect side surfaces of the first to fourth display devices 10-1 to 10-4 arranged in a lattice shape to each other to implement the tiled display device TD. The coupling member 20 may couple side surfaces of the first substrates SUB1, side surfaces of the first and second barrier insulating layers BIL1 and BIL2, side surfaces of the second substrates SUB2, side surfaces of the display layers DPL, side surfaces of the encapsulation layers TFE, and side surfaces of the anti-reflection films ARF of the display devices 10 adjacent to each other to each other.

For example, the coupling member 20 may be formed of an adhesive or a double-sided tape having a relatively small thickness to minimize an interval between the display devices 10. As another example, the coupling member 20 may be formed of a coupling frame having a relatively small thickness to minimize an interval between the display devices 10. Therefore, the tiled display device TD may prevent the coupling area SM between the display devices 10 from being recognized by the user.

The cover member 30 may be disposed on upper surfaces of the display devices 10 and the coupling member 20 to cover the display devices 10 and the coupling member 20. For example, the cover member 30 may be disposed on an upper surface of the anti-reflection film ARF of each of the display devices 10. The cover member 30 may protect an upper surface of the tiled display device TD.

FIGS. 19 to 22 are schematic cross-sectional views illustrating a method of manufacturing a display device according to another embodiment for each process.

Referring to FIGS. 19 to 22, an embodiment may be different from an embodiment of FIGS. 7 to 16 at least in that the thickness of the first substrate SUB1 may be reduced during the second etching and a third etching process may be performed to form the first contact holes CNT1 and the sub-contact holes SCNT. Hereinafter, the descriptions overlapping those of the above-described embodiment will be omitted and differences will be described.

Figure 19:
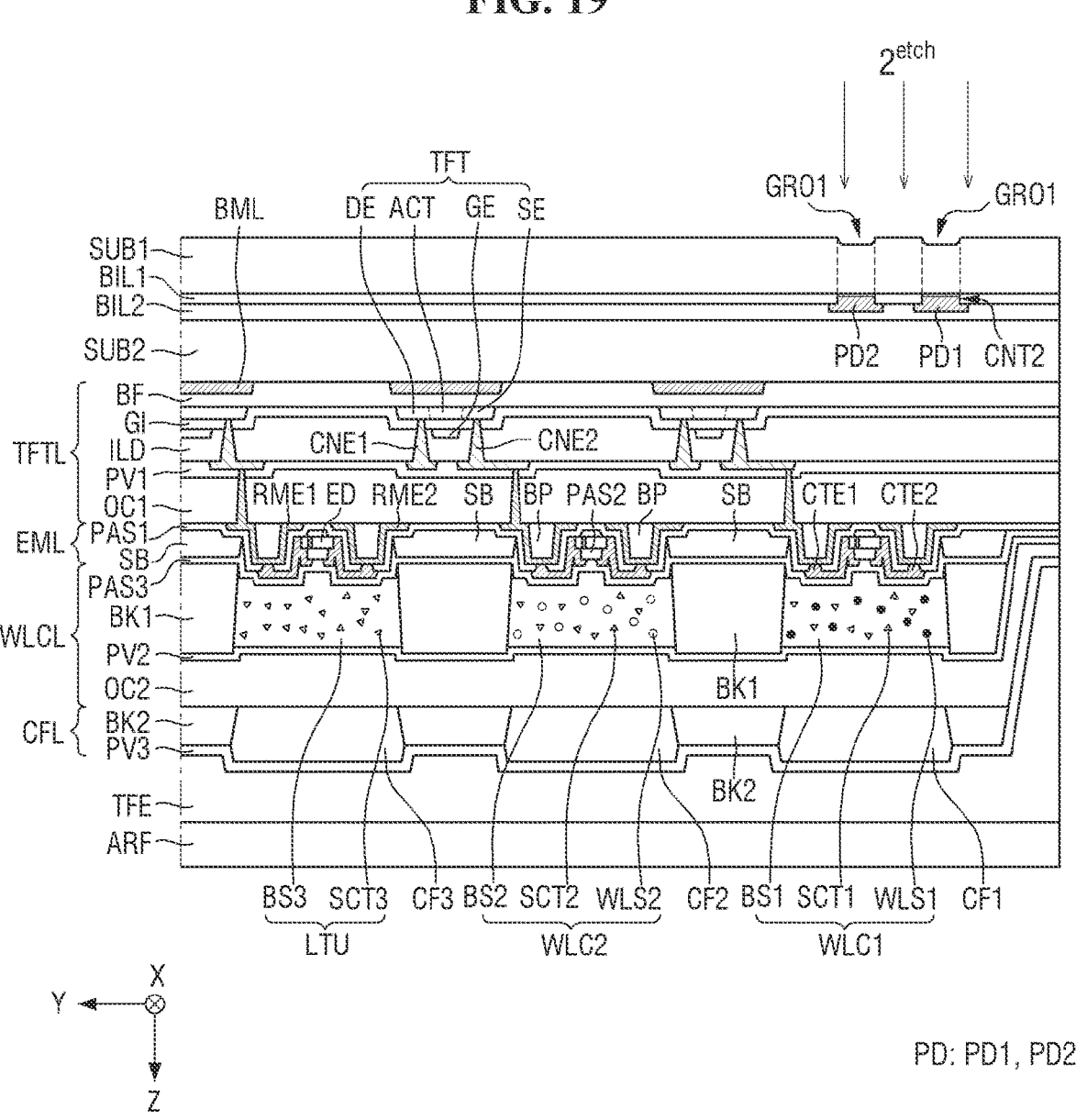

As illustrated in FIG. 19, the first grooves GRO1 are formed on a surface of the first substrate SUB1 by performing the same process of FIGS. 7 to 12 as described above.

Figure 20:
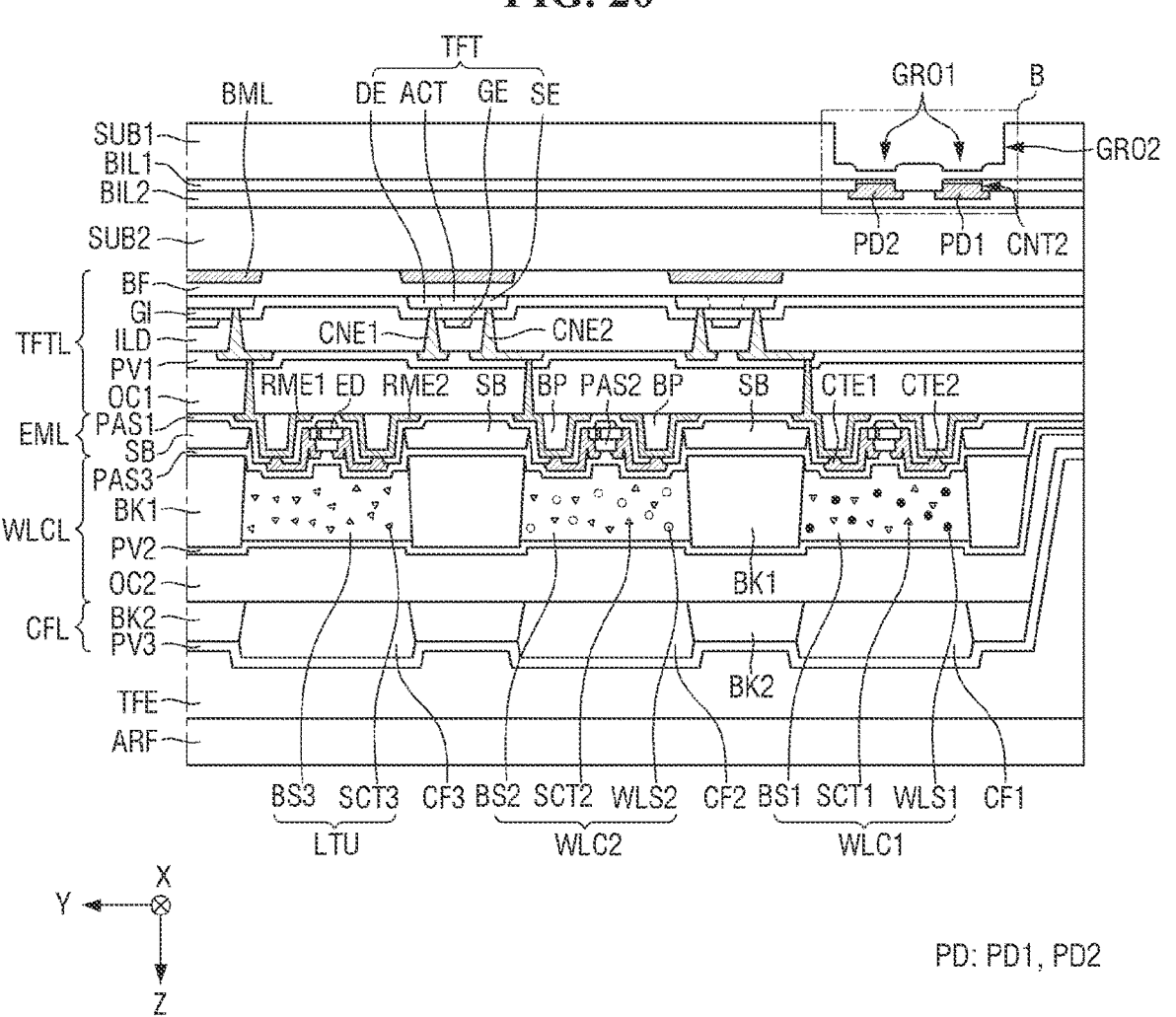
Figure 21:
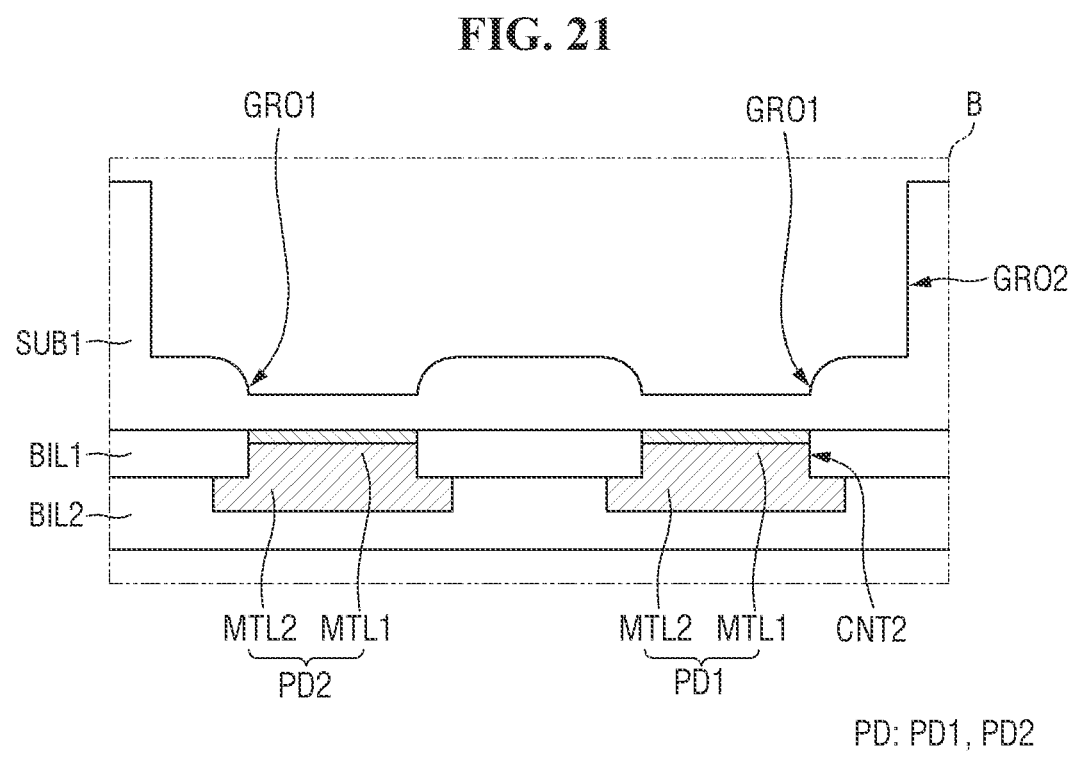

Referring to FIGS. 19 to 21, a second etching ($2^{etch}$) may be performed on a surface of the first substrate SUB1 to form a second groove GRO2. The second etching ($2^{etch}$) may use the same method as the first etching ($1^{etch}$) process described above, for example, pulse laser etching. The second groove GRO2 may be formed by reducing a thickness of the first substrate SUB1 while maintaining the shapes of the first grooves GRO1. The first grooves GRO1 may be formed on the bottom surface of the second groove GRO2 while maintaining the shape thereof. The first grooves GRO1 may be aligned to overlap the second contact holes CNT2 of the first barrier insulating layer BIL1 in the thickness direction (Z-axis direction).

In an embodiment, during the second etching ($2^{etch}$) the second groove GRO2 may be formed, but the pad electrodes PD on a lower side thereof may not be exposed. A laser used for the second etching ($2^{etch}$) process having a transmittance that increases as the thickness of the first substrate SUB1 decreases may be irradiated up to the second substrate SUB2. In case that the laser is transmitted through and irradiated to the second substrate SUB2, the second substrate SUB2 may be damaged. In an embodiment, the damage to the second substrate SUB2 may be prevented by forming the second groove GRO2 during the second etching ($2^{etch}$).

Figure 22:
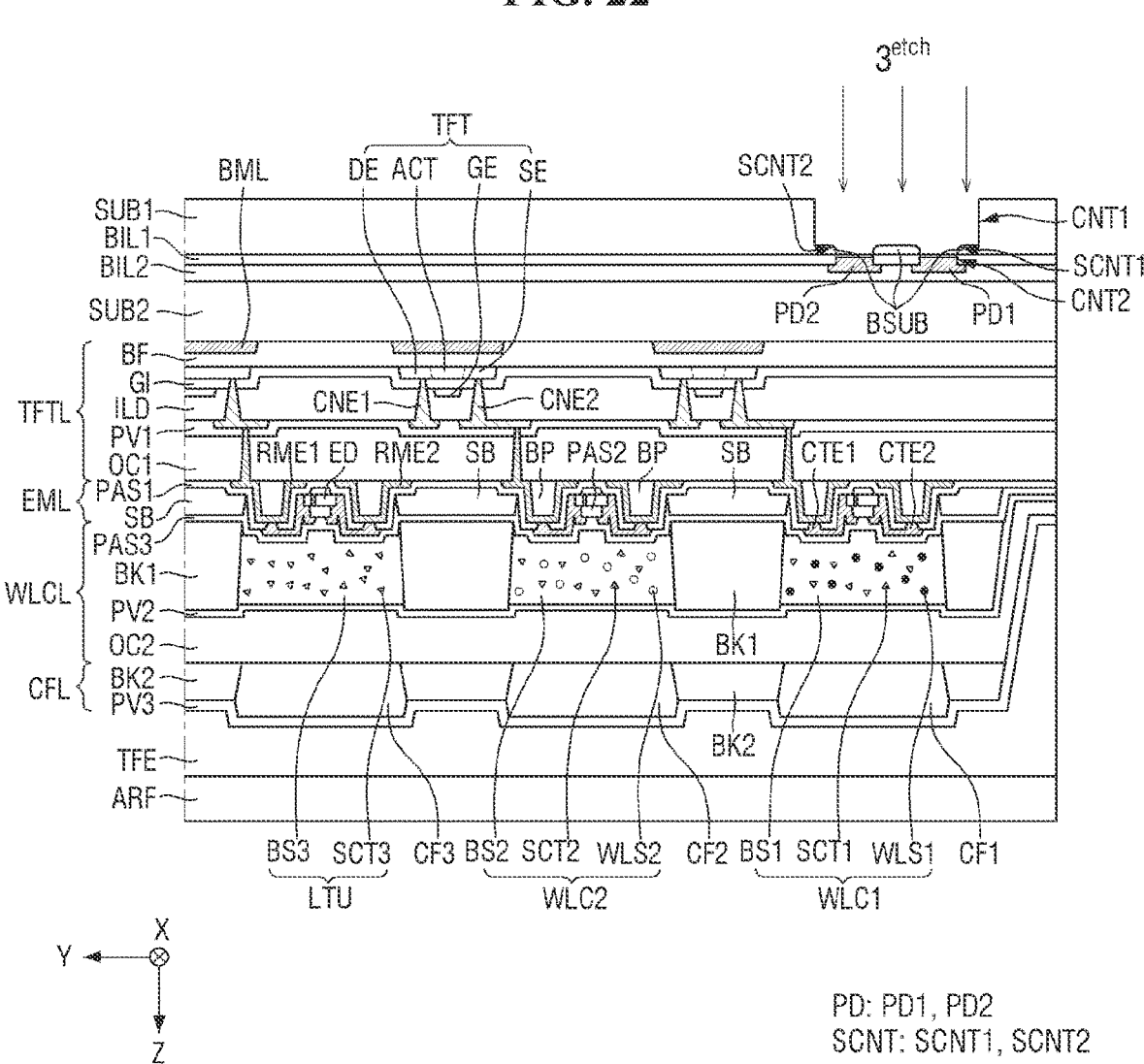

Referring to FIG. 22, a third etching ($3^{etch}$) may be performed on the second groove GRO2 of the first substrate SUB1 to form a first contact hole CNT1 and sub-contact holes SCNT. During the third etching ($3^{etch}$) the first substrate SUB1 may be etched to the same thickness and removed, and in case that the pad electrodes PD are exposed, the etching may be terminated. Specifically, the area of the first substrate SUB1 in which the first grooves GRO1 may be formed may be etched to form the sub-contact holes SCNT, thereby exposing the pad electrodes PD on a lower side thereof. For example, a first sub-contact hole SCNT1 exposes the first pad electrode PD1 and a second sub-contact hole SCNT2 exposes the second pad electrode PD2. The first substrate SUB1 in the area other than the first grooves GRO1 in the second groove GRO2 may not be completely etched and remain, and may be formed as a substrate buffer portion BSUB. The substrate buffer portion BSUB may prevent the second substrate SUB2 from being damaged by the laser in the second etching ($2^{etch}$) process.

According to an embodiment, the third etching ($3^{etch}$) may use a dry etching process or a plasma etching process, and may be performed by, for example, a plasma etching process using an atmospheric pressure (AP) plasma. The plasma etching process etches the exposed surface, thereby preventing damage to the second substrate SUB2 disposed therein. The third etching (3etch) may be performed, for example, by adjusting a power of 100 to 1000 W and a flow rate ratio of oxygen and nitrogen gas, and for example may be performed with a power of 700 W. The third etching ($3^{etch}$) may be performed using a mask in which the area in which the second groove GRO2 may be formed may be opened.

Subsequent processes may be performed as in FIGS. 15 and 16 described above to manufacture the display device 10.

FIGS. 23 to 26 are schematic cross-sectional views illustrating a method of manufacturing a display device according to still another embodiment for each process.

Referring to 23 to 26, in an embodiment, the order of the etching processes of FIGS. 11 to 14 described above may be changed. Hereinafter, the descriptions overlapping those of the above-described embodiment will be omitted and differences will be described.

Figure 23:
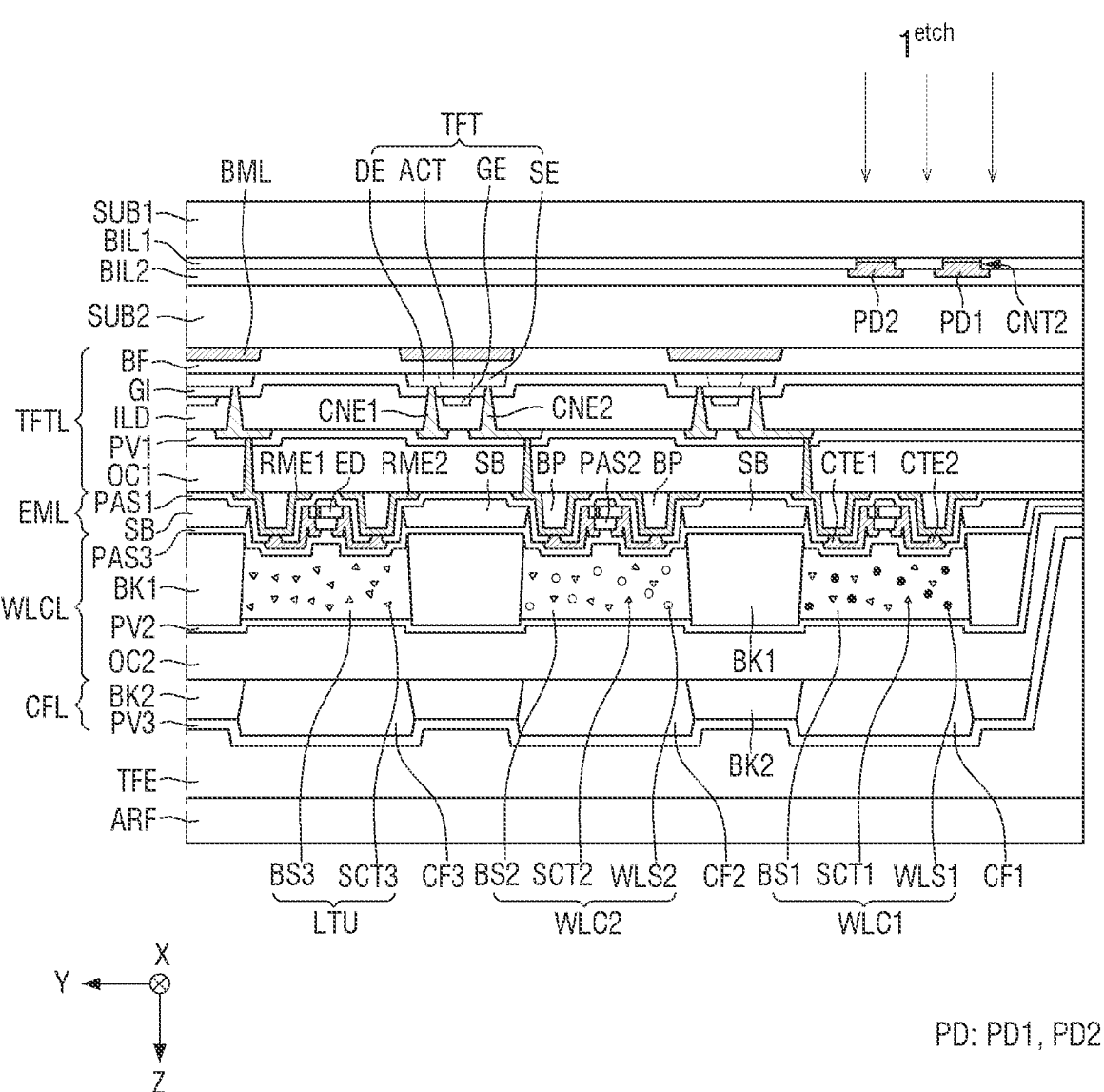
FIGS. 23 to 26 are schematic cross-sectional views illustrating a method of manufacturing a display device according to still another embodiment for each process.

As illustrated in FIG. 23, the display device 10 may be inverted by performing the same processes of FIGS. 7 to 10 as described above.

Figure 24:
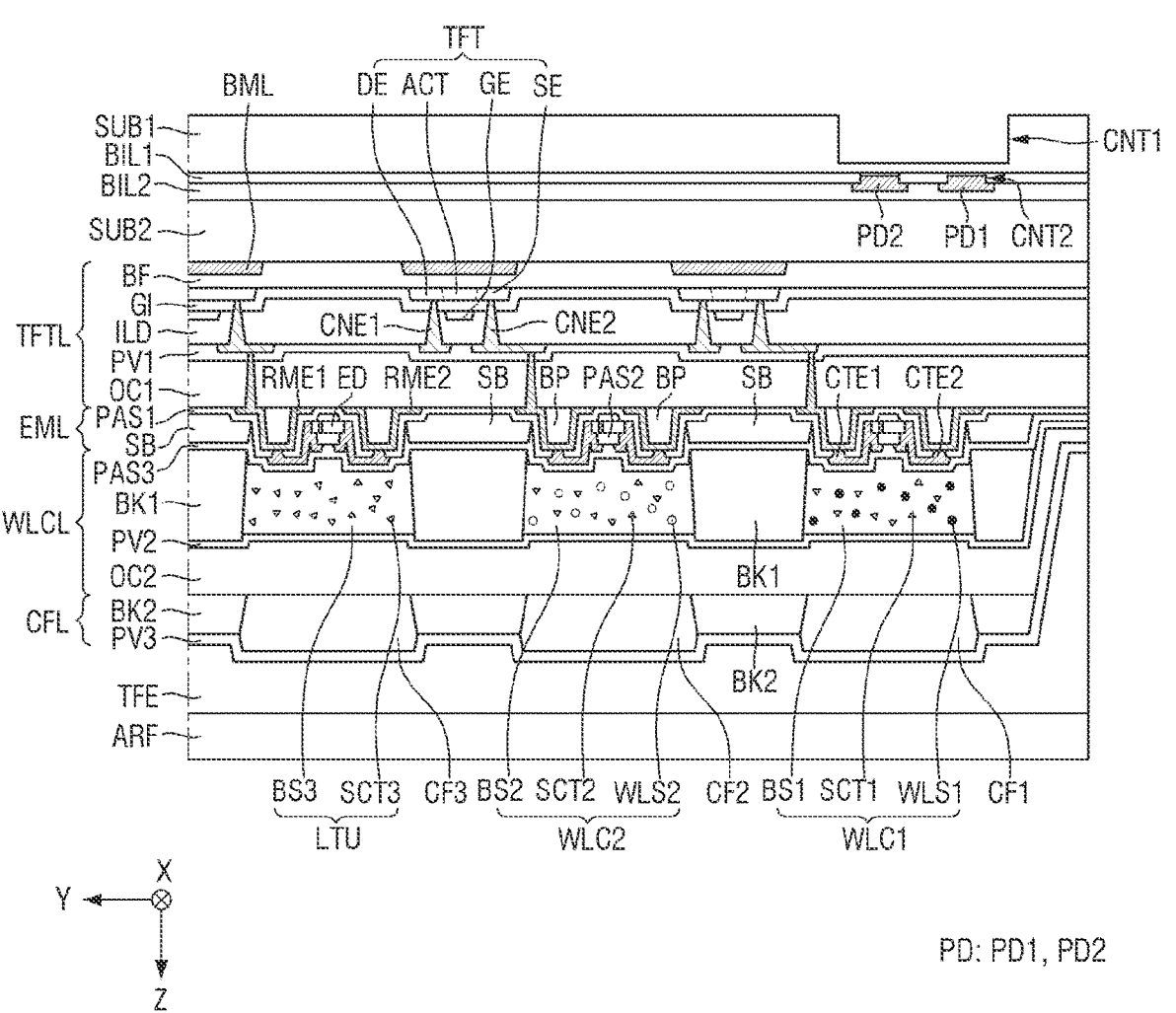

Referring to FIGS. 23 and 24, a first etching ($1^{etch}$) may be performed on a surface of the first substrate SUB1 to form a first contact hole CNT1. The first etching ($1^{etch}$) may be performed through a pulse laser etching process, and may be performed within the pulse laser etching process conditions described above. The first contact hole CNT1 may be formed to overlap the pad electrodes PD. A thickness of the first substrate SUB1 overlapping the first contact hole CNT1 may be reduced, and such a thickness may be a thickness of the substrate buffer portion BSUB of the first substrate SUB1 to be described later. In an embodiment, during the first etching ($1^{etch}$), the first contact hole CNT1 may be formed, but the pad electrodes PD on a lower side thereof may not be exposed. A laser used for the first etching ($1^{etch}$) process having a transmittance that increases as the thickness of the first substrate SUB1 decreases may be irradiated up to the second substrate SUB2. In case that the laser is transmitted through and irradiated to the second substrate SUB2, the second substrate SUB2 may be damaged. In an embodiment, the damage to the second substrate SUB2 may be prevented by forming the first contact hole CNT1 that does not penetrate through the first substrate SUB1 during the first etching ($1^{etch}$).

Figure 25:
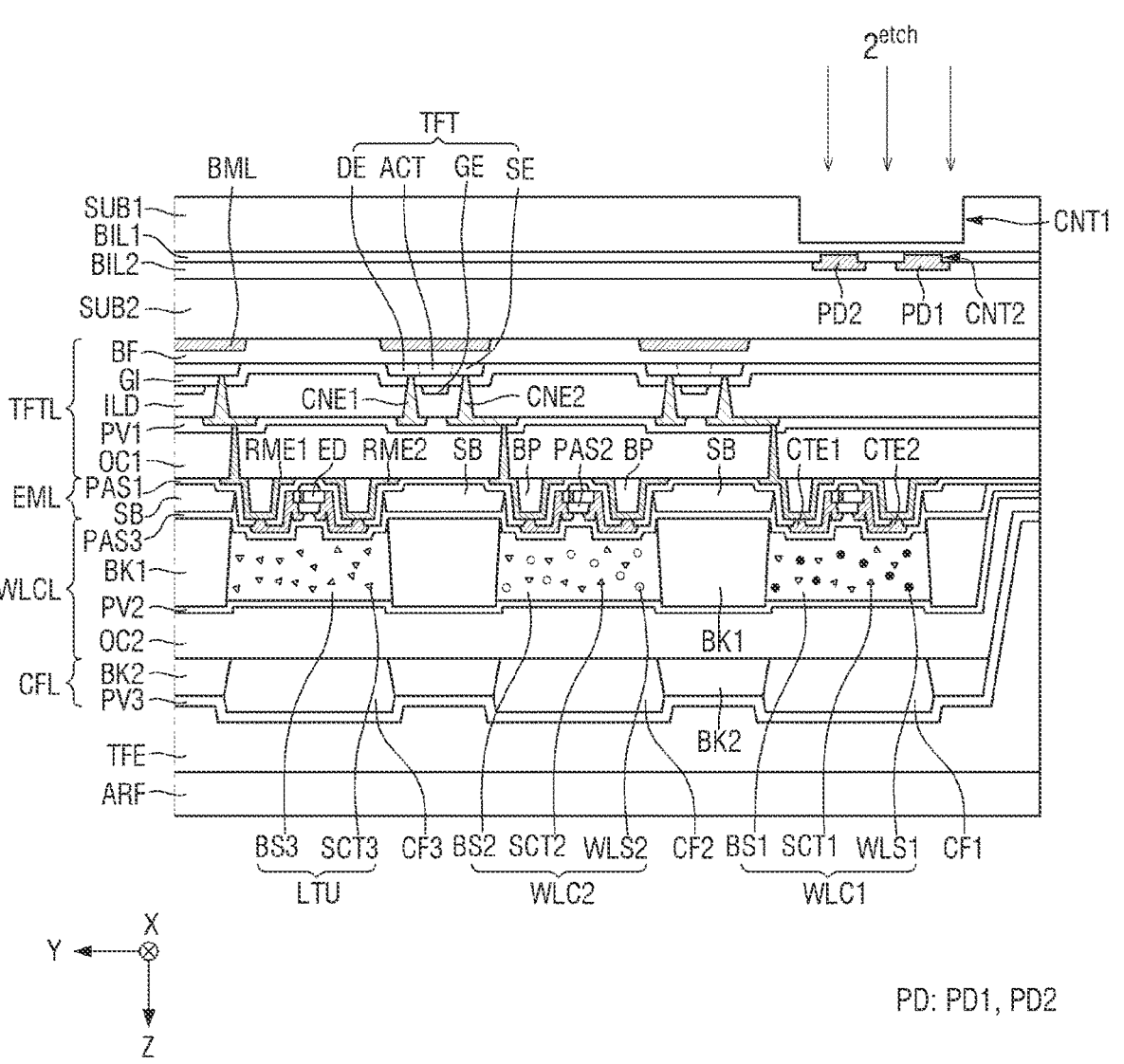
Figure 26:
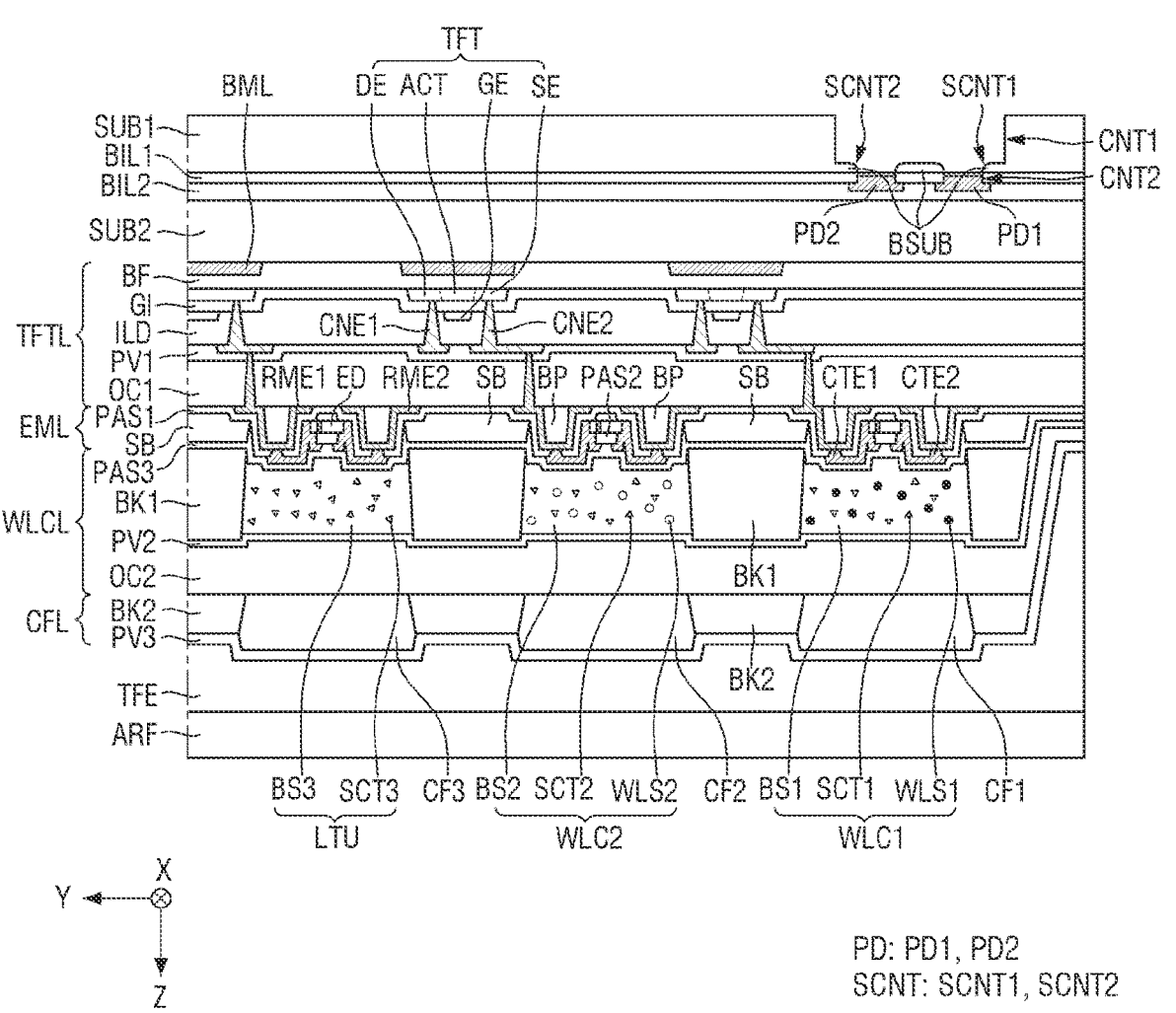

Referring to FIGS. 25 and 26, a second etching ($2^{etch}$) may be performed on a surface of the first substrate SUB1 to form sub-contact holes SCNT. The second etching ($2^{etch}$) may use the same method as the first etching ($1^{etch}$) process described above, for example, pulse laser etching. During the second etching ($2^{etch}$), an area of the first substrate SUB1, for example, an area overlapping the pad electrodes PD may be etched and removed, and in case that the pad electrodes PD may be exposed, the etching is terminated. Specifically, the first substrate SUB1 overlapping the pad electrodes PD may be etched to form the sub-contact holes SCNT, and the pad electrodes PD on a lower side thereof may be exposed by the sub-contact holes SCNT. For example, a first sub-contact hole SCNT1 exposes the first pad electrode PD1 and a second sub-contact hole SCNT2 exposes the second pad electrode PD2. The first substrate SUB1 in the area other than the sub-contact holes SCNT in the first contact hole CNT1 may not be etched and may be formed as a substrate buffer portion B SUB. The substrate buffer portion BSUB may prevent the second substrate SUB2 from being damaged by the laser in the first etching ($1^{etch}$) process.

Subsequent processes may be performed as in FIGS. 15 and 16 described above to manufacture the display device 10.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
   a first substrate having a display area and a non-display area adjacent to the display area, the first substrate including a first contact hole in the display area;
   a first barrier insulating layer disposed on the first substrate and including second contact holes overlapping the first contact hole in the display area;
   pad electrodes disposed on the first barrier insulating layer, at least a subset of the pad electrodes being disposed in the second contact holes;
   a display layer disposed on the pad electrodes, the display layer including pixels in the display area; and
   a flexible film disposed below the first substrate and electrically connected to the pad electrodes through the first contact hole and the second contact holes,
   wherein the first substrate includes a substrate buffer portion overlapping the first contact hole in the display area and not-overlapping the second contact holes in the display area,
   wherein a first thickness of the substrate buffer portion is smaller than a second thickness of the first substrate that does not overlap the first contact hole, and
   wherein the substrate buffer portion is surrounded along its periphery by the first substrate having the second thickness.

2. The display device of claim 1, wherein the first substrate includes sub-contact holes overlapping the first contact hole and overlapping the second contact holes.

3. The display device of claim 2, wherein
   the substrate buffer portion is disposed around the sub-contact holes, and
   the substrate buffer portion surrounds the sub-contact holes.

4. The display device of claim 1, wherein
   the substrate buffer portion overlaps the first barrier insulating layer, and
   the substrate buffer portion surrounds the second contact holes.

5. The display device of claim 1, wherein the first thickness of the substrate buffer portion is in a range of about 0.5 μm to about 1.5 μm.

6. The display device of claim 1, wherein the pad electrodes include a first metal layer and a second metal layer disposed on the first metal layer, and the first metal layer is adjacent to the flexible film.

7. The display device of claim 1, further comprising:

a second barrier insulating layer; and a second substrate disposed between the pad electrodes and the display layer, wherein the second barrier insulating layer covers the pad electrodes, and the second substrate is disposed on the second barrier insulating layer.

8. The display device of claim 1, further comprising:

a connection film disposed between the flexible film and the pad electrodes, wherein the connection film electrically connects the pad electrodes and the flexible film to each other.

9. The display device of claim 1, wherein the display layer includes:

a thin film transistor layer disposed on the pad electrodes;

a light emitting element layer disposed on the thin film transistor layer;

a wavelength conversion layer disposed on the light emitting element layer; and a color filter layer disposed on the wavelength conversion layer.

* * * * *